(12) United States Patent
Narahashi et al.

(10) Patent No.: US 8,382,996 B2
(45) Date of Patent: Feb. 26, 2013

(54) METAL-CLAD LAMINATE

(75) Inventors: Hirohisa Narahashi, Kanagawa (JP);
Shigeo Nakamura, Kanagawa (JP);
Tadahiko Yokota, Kanagawa (JP)

(73) Assignee: Ajinomoto Co., Inc., Tokyo (JP)

( * ) Notice: Subject to any disclaimer, the term of this patent is extended or adjusted under 35 U.S.C. 154(b) by 290 days.

(21) Appl. No.: 12/723,165

(22) Filed: Mar. 12, 2010

(65) Prior Publication Data

US 2010/0230382 A1 Sep. 16, 2010

(30) Foreign Application Priority Data

Mar. 13, 2009 (JP) .................................. 2009-061445

(51) Int. Cl.
*H01B 13/00* (2006.01)
(52) U.S. Cl. ................................ 216/13; 216/17; 29/846
(58) Field of Classification Search .................... 216/13, 216/17; 29/846, 852
See application file for complete search history.

(56) References Cited

U.S. PATENT DOCUMENTS

| | | | | |
|---|---|---|---|---|
| 2003/0054190 A1* | 3/2003 | Smith | | 428/607 |
| 2008/0073025 A1* | 3/2008 | Lee et al. | | 156/268 |
| 2010/0040874 A1 | 2/2010 | Narahashi et al. | | |
| 2010/0044078 A1 | 2/2010 | Narahashi et al. | | |

FOREIGN PATENT DOCUMENTS

| | | |
|---|---|---|
| JP | 2002-324969 | 11/2002 |
| JP | 2004-230729 | 8/2004 |

* cited by examiner

*Primary Examiner* — Roberts Culbert

(74) *Attorney, Agent, or Firm* — Oblon, Spivak, McClelland, Maier & Neustadt, L.L.P.

(57) ABSTRACT

Metal-clad laminates in which a conductor layer having superior peel strength is formed on a smooth surface of an insulating layer can be obtained by a method comprising (A) a step of preparing a metal-clad laminate precursor by providing one or more sheets of prepreg between two sheets of film having a metal film layer on a support layer, and heating and pressing them under reduced pressure, (B) a step of removing the support layer, (C) a step of removing the metal film layer, and (D) a step of forming a metal film layer on the surface of an insulating layer by electroless plating.

32 Claims, 1 Drawing Sheet

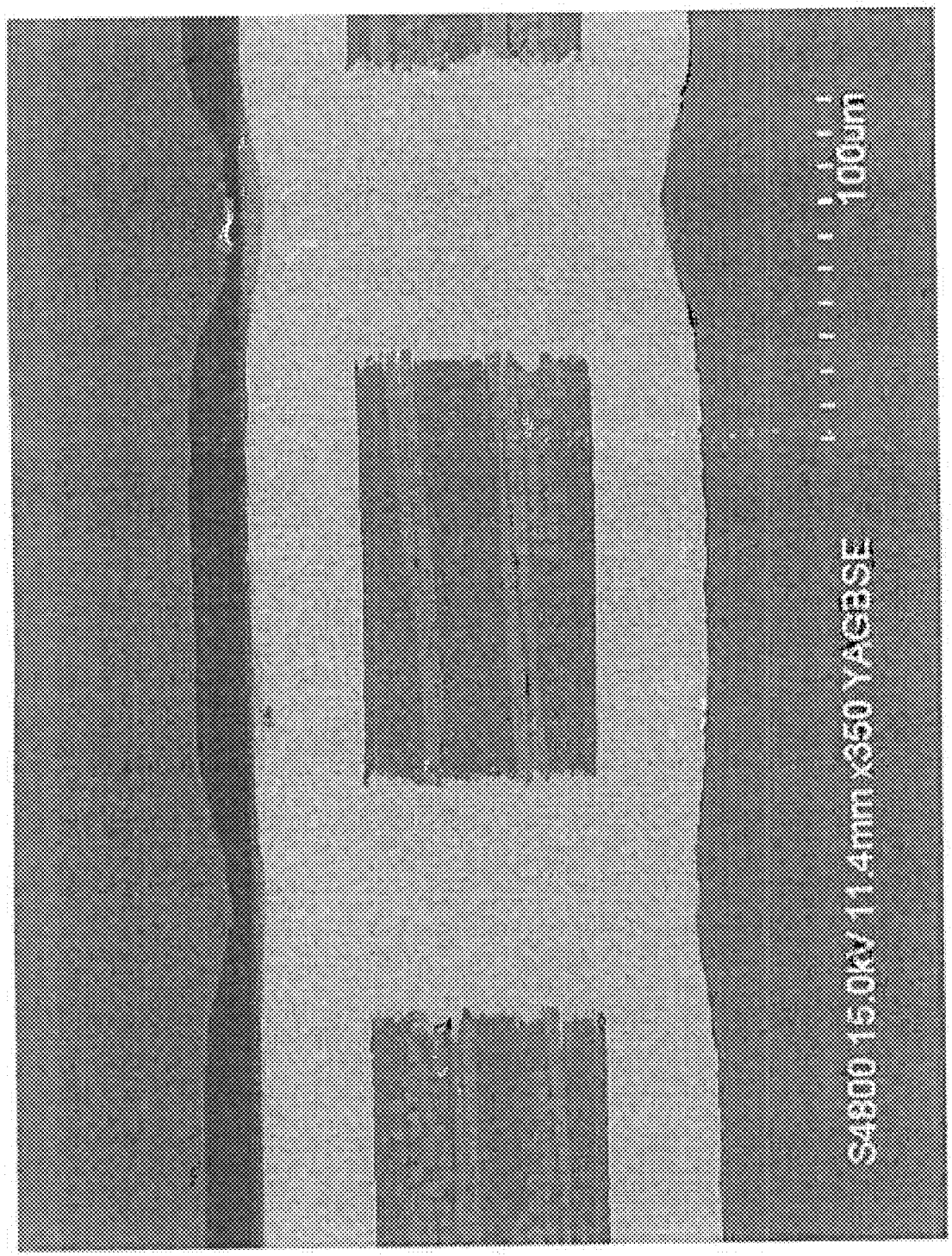

METAL-CLAD LAMINATE

CROSS REFERENCES TO RELATED APPLICATIONS

This application claims priority to Japanese Patent Application No. 2009-61445, filed on Mar. 13, 2009, which is incorporated herein by reference in its entirety.

BACKGROUND OF THE INVENTION

1. Field of the Invention

The present invention relates to methods of producing a metal-clad laminate. More particularly, the present invention is relates to methods of producing a circuit board which uses the obtained metal-clad laminate.

2. Discussion of the Background

Metal-clad laminates and circuit boards widely used for various electronic equipments are required to achieve thinning of each layer and fine wiring of circuit so as to provide downsized and high-functional electronic equipments. A metal-clad laminate is generally produced by laying one or plural sheets of prepreg, sandwiching same with copper foil, pressing and heating them under reduced pressure using a vacuum hot press machine to achieve lamination and integration. Then, a circuit board is widely prepared by forming a circuit on the thus-produced metal-clad laminate by a subtractive method using a copper foil as a conductor layer. To ensure close adhesion between the conductor layer and the prepreg layer, however, concave and convex need to be formed in the interface between the conductor layer (i.e., copper foil of metal-clad laminate) and the prepreg layer. However, when such concave and convex are formed on a conductor layer, a conductor layer in the concave and convex part of an unnecessary conductor layer to be removed by etching during circuit formation is not easily removed, and when etching is performed under conditions enabling sufficient removal of a conductor layer in the concave and convex part, a necessary conductor layer (wiring pattern to be a circuit) is problematically fused markedly, thus preventing fine wiring.

As a method for solving such a problem, a method including transferring a metal film layer capable of forming a plating seed layer onto an adhered by using a film with a metal film such as copper foil with ultra-thin metal and the like has been tried (see, e.g., JP-A-2004-230729 and JP-A-2002-324969).

The method including transferring a metal film layer capable of forming a plating seed layer onto an adhered by using a film with a metal film is considered to be an advantageous method for fine wiring, since it enables smooth formation of a conductor layer on an insulating layer. On the other hand, production of a circuit board using a metal-clad laminate is associated with the problem of susceptibility of the transferred metal film layer to damage, since a through hole formation step and a desmearing step are present before formation of a conductor layer. For example, when a desmear treatment is performed by a treatment with an oxidizer such as alkaline potassium permanganate solution and the like, a neutralization treatment with an acidic solution is necessary, during which a copper film may be damaged. Moreover, a copper film may be damaged during a pretreatment of a copper film with an acidic solution for the formation of a conductor layer by electroplating.

SUMMARY OF THE INVENTION

Accordingly, it is one object of the present invention to provide a metal-clad laminate wherein a conductor layer having superior peel strength is formed on the smooth surface of an insulating layer.

This and other objects, which will become apparent during the following detailed description, have been achieved by the inventors' discovery that the above-mentioned problems can be solved by a method of producing a metal-clad laminate comprising:

(A) a step of preparing a metal-clad laminate precursor by providing one or more sheets of prepreg between two sheets of film having a metal film layer on a support layer, and heating and pressing them under reduced pressure, (B) a step of removing the support layer, (C) a step of removing the metal film layer, and (D) a step of forming a metal film layer on the surface of an insulating layer by electroless plating.

The present invention has been completed based on such finding and the characteristics thereof are as described below.

(1) A method of producing a metal-clad laminate comprising the following steps (A)-(D):

(A) a step of preparing a metal-clad laminate precursor by providing one or more sheets of prepreg between two sheets of film having a metal film layer on a support layer, and heating and pressing them under reduced pressure, (B) a step of removing the support layer, (C) a step of removing the metal film layer, and (D) a step of forming a metal film layer on the surface of an insulating layer by electroless plating.

(2) The method of the above-mentioned (1), wherein the metal film layer of the film is formed by one or more kinds of methods selected from a vapor deposition method, a sputtering method and an ion plating method.

(3) The method of the above-mentioned (1) or (2), wherein the metal film layer of the film is formed with copper.

(4) The method of the above-mentioned (1), wherein the metal film layer is removed by etching in (C) a step of removing the metal film layer.

(5) The method of any of the above-mentioned (1) to (4), wherein the metal film layer is formed with copper in (D) a step of forming a metal film layer on the surface of an insulating layer by electroless plating.

(6) A method of producing a circuit board using a metal-clad laminate, comprising (G) a step of forming a conductor layer by electroplating after the method of any of the above-mentioned (1) to (5).

(7) The method of any of the above-mentioned (1) to (6), further comprising (E) a step of forming a through hole after (A) a step of preparing a metal-clad laminate precursor, (B) a step of removing the support layer, or (D) a step of forming a metal film layer on the surface of an insulating layer by electroless plating.

(8) The method of the above-mentioned (7), further comprising (F) a desmearing step after (E) a step of forming a through hole.

(9) The method of any of the above-mentioned (1) to (7), wherein the surface of the insulating layer after (C) a step of removing the metal film layer has an arithmetic mean roughness (Ra value) of not more than 200 nm.

(10) The method of any of the above-mentioned (1) to (9), wherein the film comprises a metal film layer formed on the support layer via a release layer.

(11) The method of the above-mentioned (10), wherein the release layer is formed with one or more kinds of water-soluble polymers selected from a water-soluble cellulose resin, a water-soluble polyester resin and a water-soluble acrylic resin.

(12) The method of the above-mentioned (11), wherein the water-soluble polyester resin is a water-soluble polyester having a sulfo group or a salt thereof and/or a carboxyl group or a salt thereof, and the water-soluble acrylic resin is a water-soluble acrylic resin having a carboxyl group or a salt thereof.

(13) The method of any of the above-mentioned (1) to (12), wherein an adhesive layer is present between the metal film layer and the prepreg in (A) a step of preparing a metal-clad laminate precursor.

(14) The method of any of the above-mentioned (10) to (13), further comprising (H) a step of removing the release layer after (B) a step of removing the support layer.

(15) The method of any of the above-mentioned (10) to (14), wherein the release layer has a layer thickness of 0.01 µm to 20 µm.

(16) The method of any of the above-mentioned (1) to (15), wherein the metal film layer of the film has a layer thickness of 25 nm to 5000 nm.

(17) The method of any of the above-mentioned (1) to (16), wherein the support layer has a layer thickness of 10 µm to 70 µm.

(18) The method of any of the above-mentioned (1) to (17), wherein the support layer is a plastic film.

(19) The method of any of the above-mentioned (1) to (17), wherein the support layer is a poly(ethylene terephthalate) film.

(20) The method of any of the above-mentioned (13) to (19), wherein the prepreg and the adhesive layer comprise an epoxy resin and a curing agent.

(21) The method of the above-mentioned (20), wherein the curing agent is a triazine skeleton-containing phenol novolac resin or a triazine skeleton-containing cresol novolac resin.

(22) The method of the above-mentioned (20) or (21), wherein the prepreg and the adhesive layer further comprise a thermoplastic resin.

(23) The method of any of the above-mentioned (20) to (22), wherein the prepreg and the adhesive layer further comprise an inorganic filler.

By the method of producing a metal-clad laminate of the present invention comprising the steps of (A) a step of preparing a metal-clad laminate precursor by providing one or more sheets of prepreg between two sheets of film having a metal film layer on a support layer, and heating and pressing them under reduced pressure, (B) a step of removing the support layer, (C) a step of removing the metal film layer, and (D) a step of forming a metal film layer on the surface of an insulating layer by electroless plating, a metal-clad laminate wherein a conductor layer having superior peel strength is formed on the smooth surface of an insulating layer can be obtained.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIG. 1 is a sectional view of the through hole filling plating of Example 7.

DETAILED DESCRIPTION OF THE PREFERRED EMBODIMENTS

In the following, the present invention is explained by illustrating a preferable embodiment thereof in detail.

The present invention provides a method of producing a metal-clad laminate comprising the following steps (A)-(D):

(A) providing one or more sheets of prepreg between two sheets of film having a first metal film layer on a support layer, and heating and pressing them under reduced pressure, to form an insulating layer consisting of the prepreg to obtain a metal-clad laminate precursor;

(B) removing said support layer;

(C) removing said metal film layer; and (D) forming a second metal film layer on a surface of said insulating layer by electroless plating.

Step (A).

Support Layer.

The support layer of the film with a metal film to be used in the present invention is a film or sheet having self-standing property, and a metal foil, a plastic film, and the like can be used. Particularly, a plastic film is preferably used. As the metal foil, aluminum foil, copper foil, and the like can be mentioned. When a metal foil is used as a support layer and the film with a metal film does not have a release layer, a metal foil made of a metal other than the metal film layer to be formed may be employed. As the plastic film, poly(ethylene terephthalate) film, poly(ethylene naphthalate), polyimide, polyamide-imide, polyamide, polytetrafluoroethylene, polycarbonate, and the like can be mentioned. Poly(ethylene terephthalate) film and poly(ethylene naphthalate) film are preferable, and economical poly(ethylene terephthalate) is particularly preferable. The surface of the support layer may be subjected to a surface treatment such as a corona treatment and the like. In addition, the surface of the support layer film on the side free of a metal film layer and a release layer may also be subjected to a surface treatment such as a mat treatment, a corona treatment, and the like. The surface of the support layer on the side where a release layer is formed preferably has an arithmetic mean roughness (Ra value) of not more than 50 nm (not less than 0 and not more than 50 nm), more preferably not more than 40 nm, still more preferably not more than 35 nm, further preferably not more than 30 nm, to prevent cracking of the metal film layer during the production of the film with a metal film. While the lower limit of the arithmetic mean roughness (Ra value) is not particularly limited, it is preferably not less than 0.1 nm, more preferably not less than 0.5 nm, from the aspects of practicality of the support. In addition, the arithmetic mean roughness of the surface of the support layer on the side where a release layer is not formed is preferably the same as the above-mentioned range in order to prevent cracking caused by a contact of the surface with the metal film layer during winding of the film with a metal film into a roll. The arithmetic mean roughness (Ra value) can be measured by a known method and, for example, an apparatus such as a noncontact surface roughness meter (e.g., WYKO NT3300 manufactured by Veeco Instruments etc.) and the like can be used for the measurement. The support may be a commercially available one and, for example, T60 (poly(ethylene terephthalate) film manufactured by Toray Industries, Inc.), A4100 (poly (ethylene terephthalate) film manufactured by Toyobo Co., Ltd.), Q83 (poly(ethylene naphthalate) film manufactured by Teijin DuPont Films Japan Limited), poly(ethylene terephthalate) film with alkyd type release agent (AL-5) manufactured by LINTEC Corporation, Diafoil B100 (poly(ethylene terephthalate) film manufactured by Mitsubishi polyester film Co., Ltd.), and the like can be mentioned.

The thickness of the support layer is preferably 10 to 70 μm, more preferably 15 to 70 μm. When the layer thickness is too small, a tendency of inferior handling property, a tendency of low release property of the support layer, a tendency of inconvenient formation of the smooth metal film layer are observed. When the layer thickness is too high, a tendency of impractical cost is observed.

Release Layer.

The film with a metal film in the present invention preferably has a release layer between a support layer and a metal film layer so that the metal film layer can be efficiently transferred to the surface of an adhered (prepreg).

The release layer can be formed using a polymer release layer made of a fluorocarbon resin, an alkyd resin, a silicone resin, a polyolefin resin, a polyvinyl alcohol resin, an acrylic resin, a polyester resin, a melamine resin, cellulose, and the like.

As the release layer, a metal film formed by a vapor deposition method, a sputtering method, an ion plating method etc., a metal release layer of a metal foil, and the like can also be used. Examples of the metal include aluminum, zinc, lead, nickel, and the like, with preference given to aluminum.

The release layer is preferably formed from one or more kinds of water-soluble polymers selected from a water-soluble cellulose resin, a water-soluble acrylic resin, and a water-soluble polyester resin, from the aspects of uniform transcription of a metal film layer and the cost for forming a release layer. These water-soluble polymer release layers permit easy formation of a release layer on a support layer and are also economically advantageous, as compared to a metal release layer. Moreover, a metal film can be uniformly formed on a curable resin composition (adhered), since the support layer can be released between the support layer and the release layer after curing of the adhered, the metal film layer is not damaged easily, and the release layer remaining on the metal film layer is conveniently removed with an aqueous solution. Among these, a water-soluble cellulose resin and a water-soluble polyester resin are more preferable, and a water-soluble cellulose resin is particularly preferable. Any of the water-soluble polymers is singly used for the water-soluble polymer release layer and two or more kinds of water-soluble polymers may also be used in a mixture. In addition, the water-soluble polymer release layer is formed with a single layer, and the water-soluble polymer to be used optionally has a multilayer structure formed with two or more different layers.

When a water-soluble polymer release layer is used as a release layer, another release layer of silicone resin, alkyd resin, fluorocarbon resin, and the like may be present between a water-soluble polymer release layer and a support layer to improve release property between these layers. In other words, when a water-soluble polymer is applied to a release layer, at least the surface of the release layer to be adhered to a metal film only needs to be formed with a water-soluble polymer and, for example, the release layer may be formed with a water-soluble polymer release layer alone, or a two-layer structure of a water-soluble polymer release layer and other release layer may be employed so that the surface of the release layer to be adhered to the metal film can be formed with a water-soluble polymer. When such water-soluble resin is employed at least as a release layer to be adhered to a metal film, a support can be released between support layer and release layer after curing of a curable resin composition (adhered), and thereafter, a metal film superior in the content uniformity can be formed on the adhered, since the release layer remaining on the metal film layer can be conveniently removed with an aqueous solution. The detachment of the support between support layer and release layer occurs in the interface between support and release layer when the release layer is formed only with the above-mentioned water-soluble resin, and when the release layer consists of two layers of other release layer such as alkyd resin and the like and the above-mentioned water-soluble resin release layer, it occurs in the interface between other release layer and the water-soluble resin release layer.

The thickness of the release layer is not less than 0.01 μm and not more than 20 μm (0.01 to 20 μm), preferably not less than 0.05 μm and not more than 10 μm, more preferably not less than 0.1 and not more than 5 μm, more preferably, not less than 0.1 μm and not more than 3 μm, more preferably not less than 0.1 μm and not more than 2 μm, more preferably not less than 0.1 μm and not more than 1 μm, more preferably not less than 0.2 μm and not more than 1 μm. The "layer thickness" here means the thickness of a release layer when it is a single layer, and the total thickness of multiple layers when it is a multilayer. For example, when the release layer is constituted with a water-soluble polymer release layer and other release layer such as silicone resin, alkyd resin, fluorocarbon resin and the like, as mentioned above, the total layer thickness of these release layers is set to the above-mentioned range. The thickness of the release layer other than the water-soluble resin release layer is preferably 0.01 to 0.2 μm. When the thickness of the release layer is too thick, inconveniences such as cracks, scars, and the like of the metal film layer due to the difference in the coefficient of thermal expansion between the metal film layer and the release layer tend to occur during thermal curing of the curable resin composition layer. When it is too thin, the release property of the support layer tend to decrease.

Water-Soluble Cellulose Resin.

The "water-soluble cellulose resin" in the present invention refers to a cellulose derivative subjected to a treatment to impart water solubility to cellulose and cellulose ether, cellulose ether ester, and the like can be preferably mentioned.

Cellulose ether is an ether formed by conversion of one or more hydroxyl groups present in one or more anhydroglucose repeat units present in cellulose polymer to form one or more ether linkage groups in the cellulose polymer. As the ether linkage group, an alkyl group (carbon number 1-4) optionally substituted by one or more kinds of substituents selected from hydroxyl group, carboxyl group, alkoxy group (carbon number 1-4) and hydroxy-alkoxy group (carbon number 1-4) can be generally mentioned. specifically, hydroxyalkyl group (carbon number 1-4) such as 2-hydroxyethyl, 2-hydroxypropyl, 3-hydroxypropyl, and the like; alkoxy (carbon number 1-4)alkyl group (carbon number 1-4) such as 2-methoxyethyl, 3-methoxypropyl, 2-methoxypropyl, 2-ethoxyethyl, and the like; hydroxy-alkoxy (carbon number 1-4)alkyl group (carbon number 1-4) such as 2-(2-hydroxyethoxy)ethyl, 2-(2-hydroxypropoxy)propyl, and the like; carboxyalkyl group (carbon number 1-4) such as carboxymethyl and the like, and the like can be mentioned. The ether linkage group in a polymer molecule may be of a single kind or plural kinds. That is, it may be cellulose ether having a single kind of ether linkage group or plural kinds of ether linkage groups.

Specific examples of cellulose ether include methylcellulose, hydroxyethylcellulose, hydroxypropylcellulose, hydroxypropylmethylcellulose, hydroxybutylmethylcellulose, hydroxyethylethylcellulose, carboxymethylcellulose, and water-soluble salts thereof (e.g., alkali metal salt such as sodium salt).

While the average number of the substituted ether group per glucose ring unit of cellulose ether is not particularly limited, it is preferably 1-6. The molecular weight of cellulose ether is preferably about 20000 to 60000 in weight-average molecular weight.

Cellulose ether ester is formed between one or more hydroxyl groups present in cellulose and one or more preferable organic acids or reactive derivatives thereof, whereby an ester linkage group is formed in cellulose ether. The "cellulose ether" here is as mentioned above, and the "organic acid" contains aliphatic or aromatic carboxylic acid (carbon number 2-8), where aliphatic carboxylic acid may be acyclic (branched or non-branched) or cyclic and saturated or unsaturated. Specific examples of aliphatic carboxylic acid include substituted or unsubstituted acyclic aliphatic dicarboxylic acid such as acetic acid, propionic acid, butyric acid, valeric acid, malonic acid, succinic acid, glutaric acid, fumaric acid, maleic acid, and the like; acyclic hydroxy-substituted carboxylic acid such as glycolic acid, lactic acid, and the like; acyclic aliphatic hydroxy-substituted di- or tri-carboxylic acid such as malic acid, tartaric acid, citric acid, and the like; and the like. As aromatic carboxylic acid, aryl carboxylic acid having a carbon number of 14 or below is preferable, and aryl carboxylic acid containing an aryl group such as phenyl or naphthyl group having one or more carboxyl groups (e.g., 1, 2 or 3 carboxyl groups), and the like are particularly preferable. The aryl group is optionally substituted by one or more (e.g., 1, 2, or 3) the same or different groups selected from hydroxy, alkoxy having 1-4 carbon atoms (e.g., methoxy) and sulfonyl. Preferable examples of aryl carboxylic acid include phthalic acid, isophthalic acid, terephthalic acid, trimellitic acid (1,2,4-benzenetricarboxylic acid) and the like.

When the organic acid has one or more carboxyl groups, preferably, only one carboxyl group of the acid foams an ester linkage with cellulose ether. For example, in hydroxypropylmethylcellulose succinate, one carboxyl group of each succinate group forms an ester linkage with cellulose, and other carboxy group is present as free acid. The "ester linkage group" is formed by a reaction of cellulose or cellulose ether with the above-mentioned preferable organic acid or a reactive derivative thereof. Preferable reactive derivative is, for example, acid anhydride such as phthalic anhydride and the like.

The ester linkage group in a polymer molecule may be of a single kind or plural kinds. That is, it may be cellulose ether ester having a single kind of ester linkage group or plural kinds of ester linkage groups. For example, hydroxypropylmethylcellulose acetate succinate is an mixed ester of hydroxypropylmethylcellulose having both a succinate group and an acetate group.

Preferably, the cellulose ether ester is an ester of hydroxypropylmethylcellulose or hydroxypropylcellulose. Specifically, hydroxypropylmethylcellulose acetate, hydroxypropylmethylcellulose succinate, hydroxypropylmethylcellulose acetate succinate, hydroxypropylmethylcellulose phthalate, hydroxypropylmethylcellulose trimellitate, hydroxypropylmethylcellulose acetate phthalate, hydroxypropylmethylcellulose acetate trimellitate, hydroxypropylcellulose acetate phthalate, hydroxypropylcellulosebutyrate phthalate, hydroxypropylcellulose acetate phthalate succinate, and hydroxypropylcellulose acetate trimellitate succinate, and the like can be mentioned. One or more kinds of these can be used.

Among these, hydroxypropylmethylcellulose phthalate, hydroxypropylmethylcellulose acetate succinate, and hydroxypropylmethylcellulose acetate phthalate are preferable.

While the average number of moles of the substituted ester group per glucose ring unit of cellulose ether ester is not particularly limited, it is preferably 0.5 to 2. The molecular weight of cellulose ether ester is preferably about 20000 to 60000 in weight-average molecular weight.

The production methods of cellulose ether and cellulose ether ester are known, and they can be obtained by reacting cellulose (pulp) derived from natural product as a starting material according to a conventional method, etherifying agent, esterifying agent. In the present invention, a commercially available product may be used. For example, "HP-55", "HP-50" (both hydroxypropylmethylcellulose phthalate), and "60SH-06" (hydroxypropylmethylcellulose) manufactured by Shin-Etsu Chemical Co., Ltd., and the like can be mentioned Water-Soluble Polyester Resin.

The "water-soluble polyester resin" in the present invention is a polyester resin substantially made from a linear polymer, which is synthesized by a general polycondensation reaction of polyvalent carboxylic acid or an ester-formable derivative thereof with polyvalent alcohol or an ester-formable derivative thereof as major starting materials, wherein a hydrophilic group is introduced into a molecule or molecular terminal. As the hydrophilic group here, organic acid group such as sulfo group, carboxyl group, phosphoric acid group, and the like or a salt thereof, and the like can be mentioned, with preference given to sulfonic acid group or a salt thereof and carboxylic acid group or a salt thereof. As the water-soluble polyester resin, one having a sulfo group or a salt thereof and/or a carboxyl group or a salt thereof is particularly preferable.

Representative examples of polyvalent carboxylic acid component of the polyester resin include terephthalic acid, isophthalic acid, phthalic acid, phthalic anhydride, 2,6-naphthalene dicarboxylic acid, 1,4-cyclohexane dicarboxylic acid, adipic acid, and the like. These can be used singly or in combination of two or more kinds thereof. In addition, a small amount of hydroxycarboxylic acid such as p-hydroxybenzoic acid and the like, and unsaturated carboxylic acid such as maleic acid, fumaric acid, itaconic acid, and the like may be used together with the above-mentioned various compounds.

Representative example of the polyvalent alcohol component of the polyester resin include ethylene glycol, 1,4-butanediol, neopentyl glycol, diethylene glycol, dipropylene glycol, 1,6-hexaneglycol, 1,4-cyclohexanemethanol, xylylene glycol, dimethylolpropionic acid, glycerol, methylolpropane, poly(tetramethyleneoxide)glycol, and the like. These can be used singly or in combination of two or more kinds thereof.

The hydrophilic group can be introduced into the molecule or molecular terminal of polyester resin by a conventionally-known method, with preference given to an embodiment of copolymerization of an ester-formable compound (e.g., aromatic carboxylic acid compound, hydroxy compound etc.) containing a hydrophilic group.

For example, when a sulfonate group is introduced, one or more kinds selected from 5-sodium sulfonate-isophthalic acid, 5-ammonium sulfonate-isophthalic acid, 4-sodium sulfonate-isophthalic acid, 4-ammonium methylsulfonate-isophthalic acid, 2-sodium sulfonate-terephthalic acid, 5-potassium sulfonate-isophthalic acid, 4-potassium sulfonate-isophthalic acid, and 2-potassium sulfonate-terephthalic acid, and the like are preferably copolymerized.

In addition, when a carboxylic acid group is introduced, for example, one or more kinds selected from trimellitic acid anhydride, trimellitic acid, pyromellitic acid anhydride, pyromellitic acid, trimesic acid, cyclobutane tetracarboxylic acid, dimethylolpropionic acid, and the like are preferably copolymerized, and a carboxylate group can be introduced into a molecule by neutralization with amino compound, ammonia, alkali metal salt and the like after the copolymerization reaction.

While the molecular weight of the water-soluble polyester resin is not particularly limited, a weight-average molecular weight of about 10000 to 40000 is preferable. When the weight-average molecular weight is less than 10000, the layer formation property tends to decrease, and when it exceeds 40000, the solubility tends to decrease.

In the present invention, the water-soluble polyester resin may be a commercially available product. For example, "PLAS COAT Z-561" (weight-average molecular weight: about 27000) and "PLAS COAT Z-565" (weight-average molecular weight: about 25000) manufactured by GOO CHEMICAL Co., Ltd., and the like can be mentioned.

Water-Soluble Acrylic Resin.

The "water-soluble acrylic resin" in the present invention is an acrylic resin which disperses or dissolves in water, since it contains a carboxyl group-containing monomer as an essential component.

The acrylic resin is preferably a water-soluble acrylic resin having a carboxyl group or a salt thereof, more preferably, an acrylic polymer containing carboxyl group-containing monomer and (meth)acrylate as essential monomer components, and other unsaturated monomer as necessary as a monomer component.

In the above-mentioned monomer component, examples of the carboxyl group-containing monomer include (meth)acrylic acid, maleic acid, fumaric acid, crotonic acid, itaconic acid, citraconic acid, maleic anhydride, monomethyl maleate, monobutyl maleate, monomethyl itaconate, monobutyl itaconate, and the like. One or more kinds of these can be used, and (meth)acrylic acid is preferable from among these.

In addition, examples of (meth)acrylate include alkyl (meth)acrylate wherein alkyl has a carbon number of 1-18, such as (meth)methyl acrylate, ethyl (meth)acrylate, n-propyl (meth)acrylate, n-butyl (meth)acrylate, isobutyl (meth)acrylate, n-pentyl (meth)acrylate, n-hexyl (meth)acrylate, n-heptyl (meth)acrylate, n-octyl (meth)acrylate, 2-ethylhexyl (meth)acrylate, nonyl (meth)acrylate, decyl (meth)acrylate, dodecyl (meth)acrylate, stearyl (meth)acrylate, and the like. One or more kinds of these can be used.

Examples of other unsaturated monomer include aromatic alkenyl compound, vinyl cyanide compound, conjugated diene compound, halogen-containing unsaturated compound, hydroxyl group-containing monomer, and the like. Examples of the aromatic alkenyl compound include styrene, α-methylstyrene, p-methylstyrene, p-methoxystyrene, and the like. As the vinyl cyanide compound, acrylonitrile, methacrylonitrile, and the like can be mentioned. Examples of the conjugated diene compound include butadiene, isoprene, and the like. Examples of the halogen-containing unsaturated compound include vinyl chloride, vinylidene chloride, perfluoroethylene, perfluoropropylene, vinylidene fluoride, and the like. Examples of the hydroxyl group-containing monomer include 2-hydroxyethyl (meth)acrylate, 2-hydroxypropyl (meth)acrylate, 3-hydroxypropyl (meth)acrylate, 2-hydroxybutyl (meth)acrylate, 4-hydroxybutyl acrylate, 4-hydroxybutyl methacrylate, α-hydroxymethylethyl (meth) acrylate, and the like. One or more kinds of these can be used.

As mentioned below, in the present invention, the release layer can be preferably formed by a method of coating and drying a coating solution containing water-soluble cellulose, water-soluble polyester, or water-soluble acrylic resin onto a support layer. When a water-soluble acrylic resin is used, the coating solution may be an emulsion or an aqueous solution.

When the water-soluble acrylic resin is an emulsion, a core shell type emulsion is preferable, and it is important in the core shell type emulsion that a carboxyl group be present in the shell of core shell particles. Therefore, the shell is constituted with an acrylic resin containing a carboxyl group-containing monomer and (meth)acrylate.

As a dispersion product (emulsion) of such core shell particles, commercially available products can be used. For example, JONCRYL 7600 (Tg: about 35° C.), 7630A (Tg: about 53° C.), 538J (Tg: about 66° C.), 352D (Tg: about 56° C.) (all manufactured by BASF Japan Ltd.), and the like can be mentioned.

When a water-soluble acrylic resin in the form of an aqueous solution is used, the acrylic resin contains a carboxyl group-containing monomer and (meth)acrylate, and importantly has a comparatively low molecular weight. Therefore, the weight-average molecular weight is preferably 1000 to 50000. When the weight-average molecular weight is less than 1000, the layer formation property tends to decrease, and when it exceeds 50000, adhesion to a support layer becomes high, the release property of the support layer after curing tends to decrease.

As an aqueous solution of such water-soluble acrylic resin, a commercially available product can be used and, for example, JONCRYL 354J (manufactured by BASF Japan Ltd.) and the like can be mentioned.

Between an emulsion and an aqueous solution of a water-soluble acrylic resin, an emulsion can be easily processed into a thin film since the molecular weight is high. Accordingly, an emulsion of a water-soluble acrylic resin is preferable.

Metal Film Layer.

As a metal to be used as the first metal film layer, an elemental metal such as gold, platinum, silver, copper, aluminum, cobalt, chrome, zinc, nickel, titanium, tungsten, iron, tin, indium, and the like and a solid solution (alloy) of two or more kinds of metals such as nickel-chrome alloy and the like can be used. From the aspects of broad utility of metal film formation, cost, easiness of removal by etching and the like, chrome, nickel, titanium, nickel-chrome alloy, aluminum, zinc, copper-nickel alloy, copper-titanium alloy, gold, silver, and copper are preferable, chrome, nickel, titanium, nickel-chrome alloy, aluminum, zinc, gold, silver, and copper are more preferable, and copper is particularly preferable. In addition, the metal film layer may be a single layer or a multilayer structure wherein two or more different metal layers are laminated. Specific examples of the multilayer structure include a constitution of copper layer/chrome layer, nickel-chrome alloy layer or titanium layer (i.e., constitution wherein a chrome layer, a nickel-chrome alloy layer or a titanium layer is formed on the support side, and a copper layer is formed thereon). Since the chrome layer, nickel-chrome alloy layer or titanium layer has resistance to etching with an acidic solution used for a desmear treatment during circuit board production and an acidic solution used for a pretreatment for electroplating, the copper layer can be protected from the desmear treatment and the pretreatment for electroplating by employing the multilayer structure. In addition, a constitution of chrome layer, nickel-chrome alloy layer, or titanium layer/copper layer (i.e., constitution wherein a copper layer is formed on the support side, and a chrome layer, nickel-chrome alloy layer, or titanium layer is formed thereon) may also be employed. In this case, a prepreg layer or adhesive layer contacts a chrome layer and the like. Depending on the kind of the resin composition of the prepreg layer or adhesive layer, due to such contact with the chrome layer, close adhesion strength to an electroless plating may become still higher in step (D) after removal of a metal film layer (after step (C)). As such resin composition, one containing a resin such as cyanate resin, maleimide, and the like can be mentioned.

When a metal foil such as copper foil and the like is used instead of the metal film layer, formation of a conductor layer having superior peel strength on the surface of a smooth insulating layer (including prepreg layer, adhesive layer, hereinafter the same) is difficult. That is, when a smooth surface such as a gloss surface of the metal foil and the like is transferred to an adhered and the metal foil is removed by etching, the surface of the insulating layer becomes smooth, and even when the conductor layer is formed by electroless plating and electroplating, sufficient conductor peel strength is difficult to achieve. On the other hand, when a roughened surface of a metal foil is transferred to an adhered and the metal foil is removed by etching and the like, the surface of the insulating layer becomes a concavo-convex roughened surface, which is disadvantageous for fine wiring even if sufficient conductor peel strength is obtained.

While the thickness of the metal film layer is not particularly limited, it is preferably 25 nm to 5000 nm, more preferably 25 nm to 3000 nm, still more preferably 100 nm to 3000 nm, particularly preferably 100 nm to 1000 nm. While the layer thickness is too small, a crack is easily developed in a metal film after the production of a film with a metal film, and a metal film layer is dissolved by washing with acid and the like, and the surface of the insulating layer tends to be roughened in a desmearing step, and the like in the production of a circuit board. When the layer thickness is too large, formation of a metal film requires a long time, and tends to be costly. When the metal film layer has a multilayer structure of copper layer/chrome layer, nickel-chrome alloy layer, or titanium layer as mentioned above, the thickness of the whole metal film layer is as mentioned above. The thickness of the chrome layer, nickel-chrome layer, or titanium layer is preferably 5 nm to 100 nm, more preferably 5 nm to 50 nm, particularly preferably 5 nm to 30 nm, most preferably 5 to 20 nm.

Film with a Metal Film.

While the production method of the film with a metal film to be used in the present invention is not particularly limited, the following method is preferable.

A film with a metal film is obtained, for example, by forming a metal film layer on a support layer. When a release layer is formed, a release layer is formed on the surface of a support layer before formation of a metal film layer, and a metal film layer is formed on the surface of a release layer.

The method of formation of a release layer is not particularly limited, and a known lamination method such as hot press, hot roll laminating, extrusion laminating, coating and drying of a coating solution and the like can be employed. Since it is convenient and a highly uniform layer can be formed, and the like, a method including coating and drying of a coating solution containing a material used for a release layer is preferable.

A metal film layer is preferably formed by one or more kinds of methods selected from a vapor deposition method, a sputtering method, and an ion plating method, and particularly preferably formed by a vapor deposition method and/or a sputtering method. These methods can be used in combination, and any of such methods can also be used alone.

A metal film layer formed by one or more kinds of methods selected from a vapor deposition method, a sputtering method, and an ion plating method has a highly smooth surface, and the surface of the insulating layer after step (C) in the present invention shows extremely low Ra value, since high smoothness of the surface of the metal film layer is reflected.

As the vapor deposition method (vacuum deposition method), a known method can be used. A film is preferably formed on a support (on a release layer when a release layer is present) by placing a support in a vacuum chamber and heating and vaporizing a metal.

For a sputtering method, a known method can be used. A film is preferably formed with ionized vaporized metal on a support (on a release layer when a release layer is present) by placing a support in a vacuum chamber, introducing an inert gas such as argon and the like, and directly applying a voltage to cause collision of the ionized inert gas with the target metal.

For an ion plating method, a known method can be used. A film is preferably formed with ionized vaporized metal on a support (on a release layer when a release layer is present) by placing a support in a vacuum chamber and, under a glow discharge atmosphere, heating and vaporizing a metal.

Prepreg.

The prepreg to be used in the present invention can be obtained by impregnating a fiber sheet substrate with a curable resin composition, followed by heating and drying. As the curable resin composition, any can be used without any particular limitation as long as the cured product has sufficient hardness and insulating property. For example, a composition containing at least a curable resin such as epoxy resin, cyanate ester resin, phenol resin, bismaleimide-triazine resin, polyimide resin, acrylic resin, vinylbenzyl resin, and the like and a curing agent thereof can be used. Of these, preferred is a composition containing an epoxy resin as a curable resin, for example, a composition containing at least (a) an epoxy resin, (b) a thermoplastic resin, and (c) a curing agent.

Examples of the epoxy resin (a) include bisphenol A type epoxy resin, biphenyl type epoxy resin, naphthol type epoxy resin, naphthalene type epoxy resin, bisphenol F type epoxy resin, phosphorus containing epoxy resin, bisphenol S type epoxy resin, alicyclic epoxy resin, aliphatic chain epoxy resin, phenol novolac type epoxy resin, cresol novolac type epoxy resin, bisphenol A novolac type epoxy resin, epoxy resin having butadiene structure, diglycidyl etherified product of bisphenol, diglycidyl etherified product of naphthalenediol, glycidyl etherified product of phenols, and diglycidyl etherified product of alcohols; as well as an alkyl substituted product, halide and hydrogenated product of these epoxy resins; and the like. Any one kind of these epoxy resins may be used alone or two or more kinds thereof may be mixed.

As the epoxy resin, bisphenol A type epoxy resin, naphthol type epoxy resin, naphthalene type epoxy resin, biphenyl type epoxy resin and epoxy resin having butadiene structure are preferable, from the aspects of heat resistance, insulation reliability and close adherence to metal films. Specifically, for example, liquid bisphenol A type epoxy resin ("Epikote 828EL" manufactured by Japan Epoxy Resins Co., Ltd.), naphthalene type bifunctional epoxy resin ("HP4032", "HP4032D" manufactured by DIC Corporation), naphthalene type tetrafunctional epoxy resin ("HP4700" manufactured by DIC Corporation), naphthol type epoxy resin ("ESN-475V" manufactured by Tohto Kasei Co., Ltd.), epoxy resin having a butadiene structure ("PB-3600" manufactured by DAICEL CHEMICAL INDUSTRIES, LTD.), epoxy resin having a biphenyl structure ("NC3000H", "NC3000L" manufactured by Nippon Kayaku Co., Ltd., "YX4000" manufactured by Japan Epoxy Resins Co., Ltd.), and the like can be mentioned.

A thermoplastic resin (b) is added for the purpose of, for example, conferring adequate flexibility to the composition after curing and the like. Examples of such thermoplastic resin include phenoxy resin, polyvinyl acetal resin, polyimide, polyamide-imide, polyethersulfone, polysulfone, and the like. Any one kind of these epoxy resins may be used alone or two or more kinds thereof may be mixed. The thermoplastic resin is preferably added in a proportion of 0.5 to 60 wt %, more preferably 3 to 50 wt %, relative to a nonvolatile component in the curable resin composition as 100 wt %. When the content ratio of the thermoplastic resin is less than 0.5 wt %, formation of a uniform curable resin composition layer tends to be difficult due to the low viscosity of the resin composition. When the content ratio exceeds 60 wt %, the viscosity of the resin composition becomes too high, and covering of the wiring pattern on the substrate tends to be difficult.

Specific examples of the phenoxy resin include FX280 and FX293 manufactured by Tohto Kasei Co., Ltd., YX8100, YL6954, YL6974, YL7213, and YL6794 manufactured by Japan Epoxy Resins Co., Ltd., and the like.

The polyvinyl acetal resin is preferably polyvinyl butyral resin. Specific examples of the polyvinyl acetal resin include Denka Butyral 4000-2, 5000-A, 6000-C, and 6000-EP manufactured by DENKI KAGAKU KOGYO KABUSHIKI KAISHA, S-LEC BH series, BX series, KS series, BL series, and BM series manufactured by SEKISUI CHEMICAL CO., LTD., and the like.

Specific examples of the polyimide include polyimide "RIKACOAT SN20" and "RIKACOAT PN20" manufactured by New Japan Chemical Co., Ltd. Moreover, a denatured polyimide such as linear polyimide obtained by reacting bifunctional hydroxyl group-terminated polybutadiene, a diisocyanate compound and tetrabasic acid anhydride (one described in JP-A-2006-37083), polyimide having a polysiloxane skeleton (those described in JP-A-2002-12667, JP-A-2000-319386 etc.), and the like can be mentioned.

Specific examples of the polyamide-imide include polyamide-imide "VYLOMAX HR11NN", and "VYLOMAX HR16NN" manufactured by Toyobo Co., Ltd., and the like, and denatured polyamide-imide such as polyamide-imide having a polysiloxane skeleton (e.g., "KS9100", "KS9300" manufactured by Hitachi Chemical Co., Ltd.), and the like.

Specific examples of the polyethersulfone include polyethersulfone "PES5003P" manufactured by Sumitomo Chemical Co., Ltd., and the like.

Specific examples of the polysulfone include polysulfone "P1700" and "P3500" manufactured by Solvay Advanced Polymers K.K, and the like.

Examples of the curing agent (c) include amine type curing agent, guanidine type curing agent, imidazole type curing agent, triazine skeleton-containing phenol type curing agent, phenol type curing agent, triazine skeleton-containing naphthol type curing agent, naphthol type curing agent, acid anhydride type curing agent, epoxy adducts thereof, microencapsulated products thereof, active ester type compounds, benzoxazine type compound, cyanate ester resins, and the like. To improve peel strength of the plating, the curing agent preferably contains a nitrogen atom in the molecular structure. Particularly, a triazine skeleton-containing phenol type curing agent and a triazine skeleton-containing naphthol type curing agent are preferable, and a triazine skeleton-containing phenol novolac resin is particularly preferable. In the present invention, one kind of a curing agent or a combination of two or more kinds thereof may be used. For example, a triazine skeleton-containing phenol type curing agent and a naphthol type curing agent may be used in combination, or a triazine skeleton-containing phenol type curing agent and an active ester type compound may be used in combination.

Specific examples of the phenol type curing agents and naphthol type curing agents include MEH-7700, MEH-7810, and MEH-7851 (manufactured by Meiwa Plastic Industries, Ltd.), NHN, CBN, and GPH (manufactured by Nippon Kayaku Co., Ltd.), SN170, SN180, SN190, SN475, SN485, SN495, SN375, and SN395 (manufactured by Tohto Kasei Co., Ltd.), TD2090 (manufactured by DIC Corporation), and the like. Specific examples of the triazine skeleton-containing phenol type curing agent include LA3018 (manufactured by DIC Corporation), and the like. Specific examples of the triazine skeleton-containing phenol-novolac curing agent include LA7052, LA7054, and LA1356 (manufactured by DIC Corporation), and the like.

As the active ester type compound, generally, a compound having two or more ester groups with high reaction activity in one molecule such as phenol esters, thiophenol esters, N-hydroxyamine esters, esters of heterocyclic hydroxy compound, and the like is preferably used. The active ester compound is preferably obtained by a condensation reaction of a carboxylic acid compound and/or a thiocarboxylic acid compound with a hydroxy compound and/or a thiol compound. Particularly, in view of heat resistance and the like, an active ester compound obtained from a carboxylic acid compound and a phenol compound or a naphthol compound is preferable. Examples of the carboxylic acid compound include benzoic acid, acetic acid, succinic acid, maleic acid, itaconic acid, phthalic acid, isophthalic acid, terephthalic acid, pyromellitic acid, and the like. As the phenol compound or naphthol compound, hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol dicyclopentadienyldiphenol, phenol-novolac, and the like can be mentioned. Two or more kinds of active ester compounds may be used in combination. As the active ester compound, those disclosed in JP-A-2004-427761 may be used, or commercially available compounds may also be used. Examples of the commercially available active ester compound include EXB-9451 and EXB-9460 (manufactured by DIC Corporation) having a dicyclopentadienyldiphenol structure, DC808 as a phenol-novolac acetylated product, YLH1026 (manufactured by Japan Epoxy Resins Co., Ltd.) as a phenol-novolac benzoylated product, and the like.

Specific examples of the benzooxazin compound include F-a, and P-d (manufactured by SHIKOKU CHEMICALS CORPORATION), HFB2006M (manufactured by SHOWA HIGHPOLYMER CO., LTD.), and the like.

The mixing ratio of epoxy resin (a) and curing agent (c) in the case of phenol type curing agent or naphthol type curing agent is preferably a ratio of phenolic hydroxyl equivalent of the curing agent of within the range of 0.4 to 2.0, more preferably within the range of 0.5 to 1.0, relative to 1 epoxy equivalent of the epoxy resin. When the equivalent ratio of the reactive groups is outside this range, the mechanical strength and water resistance of the cured product tend to decrease.

The curable resin composition can further contain, in addition to curing agent (c), (d) an accelerator. Examples of the accelerator include an imidazole type compound, pyridine type compound, organic phosphine type compound, and the like. Specific examples thereof include 2-methylimidazole, 4-dimethylaminopyridine, triphenylphosphine, and the like. When an accelerator (d) is used, its ratio to an epoxy resin is preferably 0.1 to 3.0 wt %.

In addition, the curable resin composition may contain, for low thermal expansion of the composition after curing, (e) an inorganic filler. Examples of the inorganic filler include silica, alumina, isinglass, mica, silicate, barium sulfate, magnesium hydroxide, titanium oxide, and the like. Silica and alumina are preferable, and particularly, silica such as amorphous silica, fused silica, crystal silica, synthetic silica, and the like is preferable. Silica is preferably spherical. From the aspect of insulation reliability, the inorganic filler preferably has an average particle size of not more than 3 μm, more preferably not more than 1.5 μm. The average particle size of the inorganic filler can be measured by a laser diffraction-scattering method based on the Mie scattering theory. Specifically, it can be measured by forming the particle size distribution of an inorganic filler by a laser diffraction particle size analyzer based on volume, and taking the median diameter as an average particle size. A measurement sample is preferably obtained by dispersing an inorganic filler in water by ultrasonication. As a laser diffraction particle size analyzer, LA-500 manufactured by HORIBA, Ltd., and the like can be used.

To improve humidity resistance, dispersibility and the like, an inorganic filler may be treated with one or more kinds of surface treating agent such as aminosilane type coupling agents (e.g., aminopropylmethoxysilane, aminopropyltriethoxysilane, ureidopropyltriethoxysilane, N-phenylaminopropyltrimethoxysilane, N-2 (aminoethyl)aminopropyltrimethoxysilane, and the like), epoxysilane type coupling agents (e.g., glycidoxypropyltrimethoxysilane, glycidoxypropyltriethoxysilane, glycidoxypropylmethyldiethoxysilane, glycidyl butyltrimethoxysilane, (3,4-epoxycyclohexyl)ethyltrimethoxysilane, and the like), mercaptosilane type coupling agents (e.g., mercaptopropyltrimethoxysilane, mercaptopropyltriethoxysilane, and the like), silane type coupling agents (e.g., methyltrimethoxysilane, octadecyltrimethoxysilane, phenyltrimethoxysilane, methacryloxypropyltrimethoxysilane, imidazolesilane, triazinesilane, and the like), organosilazane compounds (e.g., hexamethyldisilasane, hexaphenyldisilasane, dimethylaminotrimethylsilane, trisilazane, cyclotrisilazane, 1,1,3,3,5,5-hexamethylcyclotrisilazane, and the like), and titanate type coupling agents (e.g., butyl titanate dimer, titanium octyleneglycolate, diisopropoxytitanium bis(triethanolaminate), dihydroxytitanium bislactate, dihydroxybis(ammoniumlactate)titanium, bis(dioctylpyrophosphate)ethylene titanate, bis(dioctylpyrophosphate)oxyacetate titanate, tri-n-butoxy titanium monostearate, tetra-n-butyl titanate, tetra(2-ethylhexyl)titanate, tetraisopropylbis(dioctylphosphite)titanate, tetraoctylbis(ditridecylphosphite)titanate, tetra(2,2-diallyloxymethyl-1-butyl)bis(ditridecyl)phosphite titanate, isopropyltrioctanoyl titanate, isopropyltricumylphenyl titanate, isopropyltriisostearoyl titanate, isopropylisostearoyldiacrylictitanate, isopropyldimethacrylisostearoyl titanate, isopropyltri(dioctylphosphate)titanate, isopropyltridodecylbenzenesulfonyl titanate, isopropyltris(dioctylpyrophosphate)titanate, isopropyltri(N-amideethyl-aminoethyl)titanate, and the like).

When the nonvolatile component in a curable resin composition is 100 wt %, the content of the inorganic filler in a curable resin composition is preferably 20 to 70 wt %, more preferably 20 to 60 wt %, and further preferably 20 to 50 wt %. When the content of the inorganic filler is less than 20 wt %, the effect of lowering the coefficient of thermal expansion tends to be insufficiently exhibited, whereas when it exceeds 70 wt %, the mechanical strength of the cured product tends to decrease and the like.

The curable resin composition can contain other components where necessary. Examples of other components include flame retardants such as an organic phosphorus type flame retardant, organic nitrogen-containing phosphorus compound, nitrogen compound, silicone type flame retardant, metal hydroxide, and the like; fillers such as silicone powder, nylon powder, fluorine powder, and the like; thickeners such as ORBEN, BENTON, and the like; polymer type antifoaming agents or leveling agents such as silicone type, fluorine type, and the like; close adherence imparting agents such as imidazole type, thiazole type, triazole type, silane type coupling agents, and the like; colorants such as phthalocyanine blue, phthalocyanine green, iodine green, disazo yellow, carbon black etc., and the like.

Where necessary, a heat-curable resin other than epoxy resin such as maleimide compound, bisallylnadiimide compound, vinylbenzyl resin, vinylbenzylether resin, and the like may be added as long as the effect of the invention is exhibited. Two or more kinds of such heat-curable resins may be used in a mixture. Examples of the maleimide resin include BMI1000, BMI2000, BMI3000, BMI4000, and BMI5100 (manufactured by DAIWA Industry Co., Ltd.), BMI, BMI-70, and BMI-80 (manufactured by K.I Chemical Industry Co., Ltd.), and ANILIX-MI and (manufactured by Mitsui Fine Chemicals, Inc.), examples of the bisallylnadiimide compound include BANI-M, and BANI-X (manufactured by Maruzen Petrochemical Co., Ltd.), examples of the vinylbenzyl resin include V5000 (manufactured by SHOWA HIGHPOLYMER CO., LTD.), and examples of the vinylbenzylether resin include V1000X and V1100X (manufactured by SHOWA HIGHPOLYMER CO., LTD.).

In addition, a flame-retardant may be added as necessary as long as the effect of the invention is exhibited. Two or more kinds of such flame-retardants may be used in a mixture. Examples of the flame-retardant include an organic phosphorus flame-retardant, organic nitrogen containing phosphorus compound, nitrogen compound, silicone flame-retardant, metal hydroxide and the like. Examples of the organic phosphorus flame-retardant include phosphine compounds such as HCA, HCA-HQ, and HCA-NQ manufactured by SANKO CO., LTD., and the like, phosphorus containing benzooxazine compounds such as HFB-2006M manufactured by SHOWA HIGHPOLYMER CO., LTD., and the like, phosphate ester compounds such as REOFOS 30, 50, 65, 90, 110, TPP, RPD, BAPP, CPD, TCP, TXP, TBP, TOP, KP140 and TIBP manufactured by Ajinomoto Fine-Techno Co., Inc., PPQ manufactured by HOKKO CHEMICAL INDUSTRY CO., LTD., OP930 manufactured by Clariant, PX200 manufactured by DAIHACHI CHEMICAL INDUSTRY CO., LTD., and the like, phosphorus containing epoxy resins such as FX289 and FX310 manufactured by Tohto Kasei Co., Ltd., and the like, phosphorus containing phenoxy resins such as ERF001 manufactured by Tohto Kasei Co., Ltd., and the like, and the like. Examples of the organic nitrogen containing phosphorus compound include phosphate ester amide compounds such as SP670 and SP703 manufactured by SHIKOKU CHEMICALS CORPORATION, and the like, phosphazene compounds such as SPB100 and SPE100 manufactured by Otsuka Chemical Co., Ltd., and the like, and the like. Examples of the metal hydroxide include magnesium hydroxide such as UD65, UD650 and UD653 manufactured by Ube Material Industries, Ltd., and the like, aluminum hydroxide such as B-30, B-325, B-315, B-308, B-303, and UFH-20 manufactured by TOMOE ENGINEERING CO., LTD., and the like, and the like.

Where necessary, solid rubber particles may be added to enhance the mechanical strength of a cured product, stress relaxation effect, and the like, as long as the effect of the invention is exhibited. Such solid rubber particles are preferably not dissolved in an organic solvent used for preparation of a resin composition, are incompatible with components in a resin composition such as epoxy resin and the like, and are present in a dispersion state in a resin composition varnish. Such rubber particles are generally prepared by increasing the molecular weight of a rubber component to the level free from dissolution in an organic solvent or resin, followed by processing into particles. Examples of the rubber particles include core shell type rubber particles, crosslinked acrylic nitrile butadiene rubber particles, crosslinked styrene-butadiene rubber particles, acrylic rubber particles and the like. The core shell type rubber particles are rubber particles wherein the particles have a core layer and a shell layer, and include, for example, two-layer structure wherein the outer shell layer is constituted with a glassy polymer and the inner core layer is constituted with a rubbery polymer, or three-layer structure wherein the outer shell layer is constituted with a glassy polymer, the intermediate layer is constituted with a rubbery polymer, and the core layer is constituted with a glassy polymer and the like. The glassy polymer is constituted with, for example, methyl methacrylate polymer and the like, and the rubbery polymer layer is constituted with, for example, a butylacrylate polymer (butyl rubber) and the like. Specific examples of the core shell type rubber particles include Staphyroid AC3832, AC3816N (trade name, GANZ CHEMICAL CO., LTD.), and METABRANE KW-4426 (trade name, MITSUBISHI RAYON CO., LTD.). Specific examples of the acrylonitrile-butadiene rubber (NBR) particles include XER-91 (average particle size 0.5 µm, manufactured by JSR Corporation), and the like. Specific examples of the styrene-butadiene rubber (SBR) particles include XSK-500 (average particle size 0.5 µm, manufactured by JSR Corporation), and the like. Specific examples of the acrylic rubber particles include METABRANE W300A (average particle size 0.1 µm), and W450A (average particle size 0.5 µm) (manufactured by MITSUBISHI RAYON CO., LTD.).

The fiber sheet substrate to be used for the prepreg is not particularly limited and, for example, those conventionally used as a substrate for prepregs such as glass cloth, aramid non-woven fabric, liquid crystal polymer non-woven fabric, and the like can be used. The thickness for use as an insulation substrate is preferably 1 to 200 µm, more preferably 5 to 175 µm, further more preferably 10 to 150 µm, still more preferably 10 to 125 µm, and especially preferably 10 to 100 µm. Specific examples of the fiber sheet substrate include STYLE 1027MS (warp yarn density 75 yarns/25 mm, weft yarn density 75 yarns/25 mm, cloth weight 20 g/m$^2$, thickness 19 µm) manufactured by Asahi-SCHWEBEL Co., LTD., STYLE 1037MS (warp yarn density 70 yarns/25 mm, weft yarn density 73 yarns/25 mm, cloth weight 24 g/m$^2$, thickness 28 µm) manufactured by Asahi-SCHWEBEL Co., LTD., 1078 (warp yarn density 54 yarns/25 mm, weft yarn density 54 yarns/25 mm, cloth weight 48 g/m$^2$, thickness 43 µm) manufactured by Arisawa Mfg. Co., Ltd., 2116 (warp yarn density 50 yarns/25 mm, weft yarn density 58 yarns/25 mm, cloth weight 103.8 g/m$^2$, thickness 94 µm) manufactured by Arisawa Mfg. Co., Ltd., and the like as glass cloth. Examples of the liquid crystal polymer non-woven fabric include Vecrus (density 6 to 15 g/m$^2$) and Vectran manufactured by KURARAY CO., LTD., which are non-woven fabrics produced from a polyarylate type liquid crystal polymer by a melt-blown method, and the like.

The thickness of the prepreg is preferably 20 to 250 µm, more preferably 20 to 180 µm, further preferably 20 to 150 µm, from the aspects of cost of fiber sheet substrate and rigidity desired as an insulation substrate. The thickness of a prepreg can be controlled easily by adjusting the impregnation amount a curable resin composition. In addition, a prepreg needs to have flowability permitting lamination without a void by pressing, and a curable resin composition in a prepreg preferably has the minimum melt viscosity of 200 to 30000 poise, more preferably 1000 to 20000 poise.

When an adhesive layer is used in the method of the present invention, a prepreg pressed and heated in advance under reduced pressure can be used. Examples of such prepreg pressed and heated in advance under reduced pressure include a prepreg obtained by removing a metal layer from a commercially available metal-clad laminate, or a metal-clad laminate obtained by pressing and heating the aforementioned prepreg under reduced pressure, and a prepreg prepared by sandwiching the above-mentioned prepreg with plastic films treated with a release agent explained above, pressing and heating same under reduced pressure, and peeling off the release-treated plastic film.

While the production method of the prepreg used in the present invention is not particularly limited, the following method is preferable.

The prepreg can be produced by a known hot-melt method, a solvent method, and the like. According to the hot-melt method, a prepreg is produced by once coating, without dissolving the resin composition in an organic solvent, to a releasing paper showing good release property from the resin composition and laminating same on a sheet-like fiber substrate, or directly coating same with a die coater and the like. According to the solvent method, a sheet-like fiber substrate is immersed in a resin composition varnish obtained by dissolving a resin composition in an organic solvent to allow the sheet-like fiber substrate to be impregnated with the resin composition varnish, and dried thereafter. In addition, it can also be prepared by thermally laminating an adhesive film, comprising a curable resin composition laminated on a support, continuously from the both surfaces of a reinforcing sheet substrate under heating, pressurization conditions.

Examples of the organic solvent used for preparing varnish include ketones such as acetone, methylethyl ketone, cyclohexanone, and the like, acetic acid esters such as ethyl acetate, butyl acetate, cellosolve acetate, propylene glycol monomethylether acetate, carbitol acetate, and the like, carbitols such as cellosolve, butyl carbitol, and the like, aromatic hydrocarbons such as toluene, xylene, and the like, dimethyl formamide, dimethylacetamide, N-methylpyrrolidone, and the like. The organic solvent may be used in a combination of two or more kinds.

While the drying conditions of varnish are not particularly limited, a curable resin composition needs to show flowability and adhesiveness in the pressing step. Therefore, when varnish is dried, it is important to suppress progression of the curing of the curable resin composition. On the other hand, swelling is developed after curing when an organic solvent remains in a large amount in the prepreg. Therefore, the prepreg is generally dried to a content of an organic solvent in the curable resin composition of generally 5 wt % or less, preferably 2 wt % or less. While specific drying condition vary depending on the curing property of the curable resin composition and amount of the organic solvent in a varnish, for example, a varnish containing 30 to 60 wt % of an organic solvent is dried generally at 80° C. to 180° C. for about 3 to 13 minutes. It is possible to appropriately determine preferable drying conditions by a simple experiment.

A prepreg pressed and heated in advance under reduced pressure is prepared by removing a metal layer from a metal-clad laminate obtained by pressing and heating the aforementioned prepreg under reduced pressure, or by sandwiching the above-mentioned prepreg with plastic films treated with a release agent explained above, pressing and heating same under reduced pressure, and peeling off the release-treated plastic film.

The lamination step involving heating and pressing under reduced pressure can be performed using a conventional vacuum hot press machine. For example, it involves pressing metal plates such as heated SUS plates and the like from the side of the two support layers.

The pressing conditions are reduced pressure with degree of vacuum: generally $1 \times 10^{-2}$ MPa or below, preferably $1 \times 10^{-3}$ MPa or below. Heating and pressing can be performed in one phase. However, to control resin exudation, it is preferably performed under conditions in two or more phases. For example, pressing in the first phase is preferably performed at 70 to 150° C., pressure 1 to 15 kgf/cm$^2$, and pressing in the second phase is preferably performed at 150 to 200° C., pressure 1 to 40 kgf/cm$^2$.

Adhesive Layer.

As the adhesive layer to be used in the present invention, a curable resin composition is preferably used. The curable resin composition is not particularly limited as long as a cured product thereof has sufficient hardness and insulating property. For example, a composition at least containing a curable resin such as epoxy resin, cyanate ester resin, phenol resin, bismaleimide-triazine resin, polyimide resin, acrylic resin, vinylbenzyl resin, and the like and a curing agent therefor is used. A composition containing an epoxy resin as a curable resin is preferable. For example, a composition containing at least (a) epoxy resin, (b) thermoplastic resin and (c) curing agent is preferable. That is, those similar to the curable resin composition used for impregnating the aforementioned fiber sheet substrate of prepreg are preferably used.

In the present invention, the thickness of the adhesive layer is preferably not more than 50 μm, more preferably not more than 20 μm. When the thickness is greater than 50 μm, the obtained metal-clad laminate tends to show an increased coefficient of thermal expansion and deteriorated property such as low rigidity and the like. While the lower limit of the thickness is not particularly set, it is preferably not less than 0.1 μm to ensure adhesiveness.

When an adhesive layer is used in the present invention, after forming a metal film layer of a film (with a metal film), a curable resin composition layer is formed on the surface of the metal film layer, whereby the curable resin composition layer becomes the adhesive layer. A curable resin composition layer to be formed as an adhesive layer can be formed by a known method. For example, a curable resin composition is dissolved in an organic solvent to give a resin varnish, the resin varnish is applied to the metal film layer of the film with a die coater and the like, the organic solvent is dried by heating, hot gas blowing and the like, whereby a curable resin composition layer is formed.

Examples of the organic solvent include ketones such as acetone, methylethyl ketone, cyclohexanone, and the like, acetic acid esters such as ethyl acetate, butyl acetate, cellosolve acetate, propylene glycol monomethyl ether acetate, carbitol acetate, and the like, carbitols such as cellosolve, butylcarbitol, and the like, aromatic hydrocarbons such as toluene, xylene, and the like, dimethyl formamide, dimethylacetamide, N-methylpyrrolidone, and the like. Two or more kinds of organic solvents may be used in combination.

While the drying conditions are not particularly limited, drying is performed such that the content of the organic solvent in a curable resin composition layer is preferably not more than 10 wt %, more preferably not more than 5 wt %. Though subject to change depending on the amount of the organic solvent in the varnish and the boiling point of the organic solvent, for example, a curable resin composition layer can be formed by drying a varnish containing 30 to 60 wt % organic solvent at 50 to 150° C. for about 3 to 10 minutes.

Moreover, an adhesive layer can also be formed by preparing, independently of a film with a metal film, an adhesive film having a curable resin composition layer formed on a support layer, adhering the adhesive film to the film with a metal film under heating conditions such that the curable resin composition layer contacts the metal film layer, and detaching the support layer of the adhesive film. As the support layer of the adhesive film here, a layer similar to the support layer of the film with a metal film can be used, and as the curable resin composition layer, the aforementioned curable resin composition can be used.

The above-mentioned film with a metal film can be adhered to the adhesive film by placing the film with a metal film on the adhesive film in such a manner that the metal film layer of the film faces the curable resin composition layer of the adhesive film, and thermo-compression bonding them by hot press, hot roll, and the like. The heating temperature is preferably 60 to 140° C., more preferably 80 to 120° C. The pressure of the compression bonding is preferably 1 to 11 kgf/cm$^2$ ($9.8 \times 10^4$ to $107.9 \times 10^4$ N/m$^2$), particularly preferably 2 to 7 kgf/cm$^2$ ($19.6 \times 10^4$ to $68.6 \times 10^4$ N/m$^2$).

The adhesive layer can also be formed on the prepreg surface, besides the metal film layer of the film (with a metal film). In this case, for example, a prepreg is immersed in a resin varnish obtained by dissolving a curable resin composition in an organic solvent, or a resin varnish is applied onto a prepreg, and the organic solvent is dried by heating, hot gas blowing, and the like to form a curable resin composition layer (adhesive layer). The organic solvent and drying condition are as mentioned above.

Production of Metal-Clad Laminate Precursor.

In step (A), one or more sheets of prepreg are provided between two sheets of film with a metal film and they are heated and pressed under reduced pressure to give a metal-clad laminate precursor. When two or more sheets of prepreg are used, they may be different. In this case, two or more sheets of prepreg may have partly or completely the same or different compositions of the curable resin composition, material, thickness and the like of the fiber sheet substrates. When an adhesive layer is present between a film with a metal film and a prepreg layer, a similar method can be employed to produce a metal-clad laminate.

In view of workability, a prepreg with a metal film wherein the prepreg is adhered to the surface of the metal film layer of the film may be used. In this case, a sheet of prepreg with a metal film is disposed on another sheet of prepreg with a metal film such that the prepreg layer faces oppose each other or one or more sheets of prepreg are disposed between two sheets of prepreg with a metal film, and they are heated and pressed under reduced pressure to give a metal-clad laminate. When two sheets of prepreg with a metal film alone are used, respective sheets of prepreg with a metal film are disposed such that the prepreg layer faces thereof oppose each other, and they are heated and pressed under reduced pressure to give a laminate. When a different prepreg layer is introduced, one or more sheets of prepreg are disposed between two sheets of prepreg with a metal film, wherein a prepreg layer of the prepreg with a metal film is in contact with the other prepreg surface and they are heated and pressed under reduced pressure to give a laminate. As explained above, the prepreg to be inserted may be of the same kind as the prepreg used for the prepreg layer of the prepreg with a metal film, or different therefrom. A film with a metal film can be adhered to a prepreg by thermo-compression bonding such that the metal film layer of the film is in contact with the prepreg by hot press, batch laminating machine, roll laminating machine and the like. The heating temperature is preferably not less than 60° C. from the aspect of adhesiveness between a film with a metal film and a prepreg. When the temperature is too high, wrinkles caused by elongation of the support tend to occur on the prepreg with a metal film. Thus, for example, when a poly(ethylene terephthalate) film is used as a support, the temperature is preferably 60 to less than 140° C., more preferably 80 to 130° C. The pressure of compression bonding in the case of a batch system laminating machine is preferably 1 to 11 kgf/cm$^2$ ($9.8 \times 10^4$ to $107.9 \times 10^4$ N/m$^2$), particularly preferably 2 to 7 kgf/cm$^2$ ($19.6 \times 10^4$ to $68.6 \times 10^4$ N/m$^2$). The compression bonding time is preferably 5 seconds to 3 minutes. When a roll type laminating machine is used, the linear pressure is 1 to 15 Kgf/cm, preferably 1 to 10 kgf/cm. When the pressure is too small, the flowability of the resin composition tends to become insufficient and adhesion to a metal film layer tends to decrease. When it is too high, a predetermined film thickness cannot be maintained with ease due to resin exudation.

The laminating step containing heating and pressing under reduced pressure can be performed using a conventional vacuum hot press machine. For example, a metal plate such as heated SUS plate and the like can be pressed from the side of the both support layers.

The pressing conditions are under reduced pressure with the degree of vacuum of generally $1 \times 10^{-2}$ MPa or below, preferably $1 \times 10^{-3}$ MPa or below. The heating and pressing can also be performed in one phase. However, to control resin exudation, it is preferably performed under conditions in two or more phases. For example, pressing in the first phase is preferably performed at 70 to 150° C., pressure 1 to 15 kgf/cm$^2$, and pressing in the second phase is preferably performed at 150 to 200° C., pressure 1 to 40 kgf/cm$^2$.

Commercially available vacuum hot press machines include, for example, MNPC-V-750-5-200 (manufactured by Meiko Co., Ltd.), VH1-1603 (manufactured by KITAGAWA SEIKI CO., LTD) and the like.

When a prepreg pressed and heated in advance under reduced pressure is used, a metal-clad laminate can also be produced by laminating, on the surface of the prepreg, a film with a metal film having an adhesive layer on a metal film layer thereof, and curing or heating and pressing under reduced pressure. Moreover, a metal-clad laminate can also be produced by forming an adhesive layer on the surface of a prepreg pressed and heated in advance under reduced pressure, laminating a film with a metal film, and heating or heating and pressing under reduced pressure.

The lamination here includes lamination of a film on an adhered surface by a roll compression bonding, press compression bonding, and the like. Particularly, lamination under reduced pressure by a vacuum laminating method is preferable. In addition, the lamination method may be a batch system or continuous system using a roll.

The heating temperature for lamination is preferably 60 to 140° C., more preferably 80 to 120° C. The pressure of compression bonding is preferably 1 to 11 kgf/cm$^2$ ($9.8 \times 10^4$ to $107.9 \times 10^4$ N/m$^2$), particularly preferably 2 to 7 kgf/cm$^2$ ($19.6 \times 10^4$ to $68.6 \times 10^4$ N/m$^2$). Lamination under reduced pressure at air pressure of 20 mmHg (26.7 hPa) or below is preferable.

The vacuum laminating can be performed using a commercially available vacuum laminating machine. The commercially available vacuum laminating machine includes, for example, batch system vacuum-pressurization laminating machine MVLP-500 manufactured by Meiko Co., Ltd., Vacuum Applicator manufactured by Nichigo-Morton Co., Ltd., Rolling Dry Coater manufactured by Hitachi Industries Co., Ltd., vacuum laminating machine manufactured by Hitachi AIC Inc., and the like.

While the curing conditions after lamination vary depending on the kind and the like of the curable resin, the curing temperature is preferably 120 to 200° C. and the curing time is preferably 15 to 90 minutes. Curing from a comparatively low curing temperature to a high curing temperature, or curing while raising the temperature is preferable since wrinkles on the surface of the insulating layer can be prevented.

The conditions of heating and pressing under reduced pressure are as mentioned above.

In step (A'), the lamination is cured using an oven, a vacuum laminating, a vacuum hot press machine and so on, as is mentioned above.

Step (B).

In step (B), a support layer is generally removed manually or mechanically using an automatic detaching apparatus. When a metal foil is used as a support layer, the support layer can also be removed by etching. The support layer is detached after formation of an insulating layer by a curing treatment of a curable resin composition layer. When the support layer is detached before a curing treatment, the metal film layer tends to be insufficiently transferred or a metal film layer tends to develop cracks after curing of the curable resin composition. When step (E) for forming a through hole to be mentioned below is performed, the removal of the support layer of step (B) (when a release layer remains on a metal film layer, removal of the support layer and release layer) may be performed before or after step (E) for forming a through hole.

Step (C).

The removal of the metal film layer in step (C) is performed by etching with a solution dissolving the metal forming the metal film layer. The metal film layer is preferably removed by etching after a step of forming a through hole, and more preferably removed by etching after a step of forming a through hole and a desmearing step. The etchant can be selected from known ones according to the selected metal layer and, for example, an acidic etchant such as aqueous ferric chloride solution, an aqueous solution of sodium peroxodisulfate and sulfuric acid, and the like, an alkaline etchant such as CF-6000 manufactured by MEC COMPANY LTD., E-PROCESS-WL manufactured by Meltex Inc., and the like can be used for copper. For nickel, an etchant containing nitric acid/sulfuric acid as a main component can be used and commercially available products include NH-1865 manufactured by MEC COMPANY LTD., MELSTRIP N-950 manufactured by Meltex Inc., and the like. When a release layer remains on a metal film layer, the release layer and the metal film layer are preferably removed simultaneously.

The surface of the insulating layer after step (C) shows an arithmetic mean roughness (Ra value) of not more than 200 nm, and realizes a surface with high smoothness. When a metal film layer is laminated on the surface of the insulating layer by step (A) and the metal film layer is removed by step (C), the arithmetic mean roughness (Ra value) of the surface of the insulating layer is influenced by the roughness of the metal layer surface in step (A), which is in contact with the surface of the insulating layer during formation of the insulating layer. A metal foil such as copper foil and the like, which is produced by rolling, electrodeposition and the like, shows poor surface smoothness and, as described in Comparative Example 1 to be mentioned later, when the metal film layer in step (A) is an electrolytic copper foil, the surface of the insulating layer after removal of the electrolytic copper foil shows an Ra value exceeding 1000 nm. In contrast, the metal film layer in step (A), which is formed by one or more kinds of methods selected from a vapor deposition method, a sputtering method and an ion plating method shows high surface smoothness and, since the surface of the insulating layer after step (C) in the present invention reflects the high smoothness of the surface of the metal film layer, an extremely low Ra value is realized. To enable formation of fine wiring by high smoothness, the upper limit of the arithmetic mean roughness (Ra value) of the surface of the insulating layer is preferably not more than 200 nm, more preferably not more than 160 nm, further preferably not more than 130 nm, still more preferably not more than 110 nm, especially preferably not more than 90 nm, and particularly preferably not more than 70 nm. On the other hand, the lower limit of the arithmetic mean roughness (Ra value) of the surface of the insulating layer is preferably not less than 0.1 nm, more preferably not less than 0.5 nm, and further preferably not less than 1 nm, to achieve high peel strength.

Step (D).

The step of forming a second metal film layer on the surface of an insulating layer by electroless plating in step (D) can be performed by a known method. For example, the surface of the insulating layer is treated with a surfactant etc., a plating catalyst such as palladium and the like is applied, and the layer is immersed in an electroless plating solution to give a metal film. As the metal, copper, nickel, gold, palladium, and the like can be mentioned, with preference given to copper. The thickness thereof is preferably 0.1 to 5.0 Particularly, from the aspects of sufficient coating on a resin surface and cost, it is preferably 0.2 to 2.5 μm, more preferably 0.2 to 1.5 μm. The above-mentioned metal film layer may also be formed by a direct plating method which is one kind of electroless plating.

Step (E).

In the method of the present invention, (E) a step of forming a through hole can be further performed. Step (E) is not particularly limited as long as the object is achieved, and a through hole can be formed by a known method where a mechanical drill or laser such as carbon dioxide gas laser, YAG laser etc. may also be used.

The method of the present invention may contain (E) a step of forming a through hole after (A) a step of preparing a metal-clad laminate precursor or (B) a step of removing the support layer or (D) a step of forming a metal film layer on the surface of an insulating layer by electroless plating. (E) a step of forming a through hole is performed before (G) a step of forming a conductor layer by electroplating.

When the support layer is a plastic film, (E) a step of forming a through hole can be applied to the surface of the support layer before removal thereof and is preferably performed after (A) a step of preparing a metal-clad laminate precursor. When a release layer remains after removal of the support layer, it can also be applied to the surface of the release layer and is preferably performed after (B) a step of removing the support layer. To prevent roughening of the surface of the insulating layer, it is preferably performed after (D) a step of forming a metal film layer on the surface of an insulating layer by electroless plating. When a through hole is formed after removal of the metal film layer, it is more preferably performed before (C) a step of removing the metal film layer. This is because the surface of the insulating layer is roughened when an oxidizer treatment using an alkaline permanganate solution and the like is performed in a desmearing step after formation of a through hole, and the arithmetic mean roughness becomes high. When a through hole is formed by a laser on the surface of a support layer or release layer, the support layer and/or release layer may contain a laser absorbing component so as to improve laser processability. As the laser absorbing component, metal compound powder, carbon powder, metal powder, black dye, and the like can be mentioned. The amount of the laser-energy absorbing component is preferably 0.05 to 40 wt %, more preferably 0.1 to 20 wt %, further preferably 1 to 10 wt %, of the total components constituting the layer containing the component. For example, when the component is contained in a release layer formed with a water-soluble resin, it is preferably added in the above-mentioned content based on the total content including the water-soluble resin and the component as 100 wt %. As a carbon powder, powders of carbon black such as furnace black, channel black, acetylene black, thermal black, anthracene black and the like, black lead powder, a mixed powder thereof and the like can be mentioned. As the metal compound powder, titanias such as titanium oxide and the like, magnesias such as magnesium oxide and the like, oxides of iron such as iron oxide and the like, oxides of nickel such as nickel oxide and the like, manganese dioxide, oxides of zinc such as zinc oxide and the like, silicon dioxide, aluminum oxides, oxides of rare earth, oxides of cobalt such as cobalt oxide and the like, oxides of tin such as tin oxide and the like, oxides of tungsten such as tungsten oxide and the like, silicon carbide, tungsten carbide, boron nitride, silicon nitride, titanium nitride, aluminum nitride, barium sulfate, sulfates of rare earth acid, a mixed powder thereof and the like can be mentioned. As the metal powder, silver, aluminum, bismuth, cobalt, copper, iron, magnesium, manganese, molybdenum, nickel, palladium, antimony, silicon, tin, titanium, vanadium, tungsten, zinc, alloy thereof or a mixed powder, and the like can be mentioned. As the black dye, azo (monoazo, disazo etc.) dye, azo-methine dye, anthraquinone type dye, quinoline dye, ketone-imine dye, fluorone dye, nitro dye, xanthene dye, acenaphthene dye, quinophthalone dye, aminoketonedye, methine dye, perylene dye, coumarin dye, perinone dye, triphenyl dye, triallylmethane dye, phthalocyanine dye, inkro-phenol dye, azine dye, a mixture thereof, and the like can be mentioned. The black dye is preferably a solvent soluble black dye to improve dispersibility in a water-soluble resin. Such laser-energy absorbing components may be used alone or in a mixture of different kinds thereof. The laser-energy absorbing component is preferably a carbon powder, particularly carbon black, from the aspects of conversion efficiency of laser-energy to heat, broad utility and the like.

Step (F).

In the method of the present invention, (F) a desmearing step can be further performed. (F) a desmearing step is preferably performed after a step of forming a through hole. Such desmearing step can be performed by a known method such as a dry process of plasma and the like, a wet process by an oxidant treatment using an alkaline permanganate solution and the like, and the like. The desmearing step mainly removes wall surface residues produced by formation of a through hole, and aims to roughen the wall surfaces. Particularly, desmearing with an oxidant is preferable since the residue is removed while simultaneously roughening the via wall surfaces with an oxidant, thus improving the plating adhesion strength. When a through hole is formed from the surface of a support layer, the desmearing step can be performed before or after detachment of the support layer. Particularly, it is preferably performed after detachment of the support layer (when a release layer remains, after removal of the release layer). As mentioned above, to prevent the surface of the insulating layer from being roughened, the desmearing step is more preferably performed before (C) a step of removing the metal film layer. A desmearing step with an oxidant preferably includes a swelling treatment with a swelling solution, a roughening treatment with an oxidant and a neutralization treatment with a neutralizing solution in this order. While the swelling solution is not particularly limited, an alkaline solution, surfactant solution, and the like can be mentioned, with preference given to an alkaline solution. As the alkaline solution, sodium hydroxide solution and potassium hydroxide solution are more preferable. Examples of the commercially available swelling solution include Swelling Dip Securiganth P and Swelling Dip Securiganth SBU manufactured by ATOTECH Japan K.K., and the like. While the swelling treatment with a swelling solution is not particularly limited, specifically, a swelling solution at 30 to 90° C. is applied for 1 minute to 15% minutes. In view of workability and prevention of excess swelling of a resin, a method of immersing in a swelling solution at 40 to 80° C. for 5 seconds to 10 minutes is preferable. While the oxidant is not particularly limited, for example, an alkaline permanganate solution obtained by dissolving potassium permanganate or sodium permanganate in an aqueous sodium hydroxide solution can be mentioned. A roughening treatment with an oxidant such as alkaline permanganate solution and the like is preferably performed by immersing in an oxidant solution heated to 60° C. to 80° C. for 10 minutes to 30 minutes. The concentration of permanganate in the alkaline permanganate solution is preferably 5 to 10 wt %. Examples of the commercially available oxidant include alkaline permanganate solutions such as Concentrate Compact CP, and Dosing Solution Securiganth P manufactured by ATOTECH Japan K.K., and the like. As the neutralizing solution, an acidic aqueous solution is preferable, and as commercially available products, Reduction Solution Securiganth P (neutralizing solution) manufactured by ATOTECH Japan K.K. can be mentioned. For a treatment with a neutralizing solution, a method including application of a neutralizing solution at 30 to 80° C. for 5 minutes to 30 minutes to a surface after a roughening treatment with an oxidant solution can be used. In view of workability and the like, a method including application of a neutralizing solution at 40 to 70° C. for 5 minutes to 20 minutes to an object after a roughening treatment with an oxidant solution is preferable.
Step (G).

In the method of the present invention, (G) a step of forming a conductor layer by electroplating can be further performed. The step (G) is preferably performed after formation of a metal film layer on the surface of the insulating layer by electroless plating (step (D)) by forming a conductor layer by electroplating by utilizing the metal film layer. By performing the step (G), a circuit board can be produced. A conductor layer can be formed by a known method such as a semi-additive method and the like. For example, a plating resist is formed and, using the metal film layer formed in step (D) as a plating seed layer, a conductor layer is formed by electroplating. As a conductor layer by electroplating (electroplating layer), copper is preferable, and its thickness is preferably 3 to 35 µm, more preferably 5 to 30 depending on the design of a desired circuit board. After electroplating, the plating resist is removed with a plating resist removing solution such as an aqueous alkaline solution and the like, and the plating seed layer is removed, whereby a wiring pattern can be formed. The plating seed layer can be removed by a method similar to that for removing the metal film layer in step (C).

(G) a step of forming a conductor layer by electroplating is preferably performed after (E) a step of forming a through hole, and more preferably performed after (F) a desmearing step after (E) a step of forming a through hole.

When a prepreg has a small thickness, after formation of a through hole, the inside of the through hole can be filled by plating simultaneously with the step of forming a conductor layer by electroplating. This is called through hole filling plating, which is advantageous in that the production step of a circuit board can be shortened. Since the through hole filling plating is performed, the thickness of the fiber sheet substrate to be used for a prepreg is preferably not more than 200 µm, more preferably not more than 175 µm, further preferably not more than 150 µm, still more preferably not more than 125 µm, and especially preferably not more than 100 µm. Considering the handling property, the thickness is preferably not less than 1 µm, more preferably not less than 5 µm, and further preferably not less than 10 µm.
Step (H).

In the method of the present invention, (H) a step of removing the release layer can be further performed. When a release layer is present between a support layer and a metal film layer and a release layer remains on the metal film layer after removal of the support layer, (H) a step of removing the release layer is preferably performed after (B) a step of removing the support layer. In addition, (E) a step of forming a through hole may be performed either before or after step (H). For removal of the release layer (step (H)), for example, a metal release layer can be removed by dissolving the metal with an etchant, and a water-soluble polymer release layer can be removed with an aqueous solution.

When a water-soluble polymer comprised of one or more kinds selected from water-soluble cellulose resin, water-soluble acrylic resin, and water-soluble polyester resin is employed as a release layer, a support layer can be released between support layer and release layer after curing of a curable resin composition (adhered), and thereafter, the release layer remaining on the metal film layer can be conveniently removed with an aqueous solution. As an aqueous solution to remove the release layer by dissolution, an alkaline aqueous solution obtained by dissolving sodium carbonate, sodium hydrogen carbonate, sodium hydroxide, potassium hydroxide, and the like in water at a concentration of 0.5 to 10 wt %, and the like can be preferably mentioned. As long as no problem is posed for the production of a circuit board and the like, the aqueous solution may contain alcohol such as methanol, ethanol, isopropyl alcohol, and the like. The method of removing the release layer by dissolution is not particularly limited and, for example, a method including detaching a support layer and immersing the substrate in an aqueous solution to allow removal by dissolution, a method including blowing an aqueous solution in spray or mist to allow removal by dissolution, and the like can be mentioned. The temperature of the aqueous solution is preferably room temperature to 80° C., and the time of treatment with an aqueous solution such as immersion in water, blowing and the like is preferably 10 seconds to 10 minutes. As the aqueous alkaline solution, an alkaline type developer (e.g., 0.5 to 2 wt % aqueous sodium carbonate solution, 25° C. to 40° C.) for alkaline developing machines, a removing solution (e.g., 1 to 5 wt % aqueous sodium hydroxide solution, 40 to 60° C.) for dry film peeling machines, a swelling solution (e.g., aqueous alkali solution containing sodium carbonate, sodium hydroxide, and the like, 60 to 80° C.) used in the desmearing step, and the like, which are used for production of a multilayer printed wiring board, can also be used.

As is clear from Examples to be mentioned later, the method of the present invention can form a conductor layer superior in peel strength on an extremely smooth surface of an insulating layer having an arithmetic mean roughness (Ra value) of not more than 200 nm.

Other features of the invention will become apparent in the course of the following descriptions of exemplary embodiments which are given for illustration of the invention and are not intended to be limiting thereof.

EXAMPLES

In the following examples, "part" means "parts by weight".

Example 1

Preparation of Film with Metal Film

In a mixed solvent having a mass ratio of methyl ethyl ketone (hereinafter to be abbreviated as "MEK") and cyclohexanone of 1:1, hydroxypropylmethylcellulose phthalate ("HP-55" manufactured by Shin-Etsu Chemical Co., Ltd.) was dissolved at 60° C. to give a hydroxypropylmethylcellulose phthalate solution (solid content of 10%). The solution was applied onto a 38 μm-thick poly(ethylene terephthalate) (hereinafter to be abbreviated as "PET") film with a die coater. The solvent was removed by raising the temperature from room temperature to 140° C. at temperature rise rate 3° C./second in a hot air drying oven to form a hydroxypropylmethylcellulose phthalate layer (release layer, about 1 μm). Then, a copper layer (about 1000 nm) was formed on the hydroxypropylmethylcellulose phthalate layer by vapor deposition to give a film with a metal film.

Preparation of Prepreg.

Liquid bisphenol A type epoxy resin (epoxy equivalent 180, "Epikote 828EL" manufactured by Japan Epoxy Resins Co., Ltd., 28 parts) and naphthalene type tetrafunctional epoxy resin (epoxy equivalent 163, "HP4700" manufactured by DIC Corporation, 28 parts) and phenoxy resin ("YX6954BH30" manufactured by Japan Epoxy Resins Co., Ltd., 20 parts) were dissolved in a mixed solvent of MEK (15 parts) and cyclohexanone (15 parts) with stirring while heating. Thereto were added triazine-containing phenol novolac resin (hydroxyl equivalent 125, "LA7054" manufactured by DIC Corporation, 27 parts), MEK solution (27 parts) with a 50% solid content of naphthol type curing agent (hydroxyl equivalent 215, "SN-485" manufactured by Tohto Kasei Co., Ltd.), curing catalyst ("2E4MZ" manufactured by SHIKOKU CHEMICALS CORPORATION, 0.1 part), spherical silica (average particle size 0.5 μm, "SOC2" manufactured by Admatechs Company Limited, 70 parts), ethanol and toluene (1:1) solution (30 parts) with a 15% solid content of polyvinyl butyral resin ("KS-1" manufactured by SEKISUI CHEMICAL CO., LTD.), and the mixture was uniformly dispersed in a high-speed rotary mixer to give a varnish of a curable resin composition. A 2116 glass cloth (manufactured by Arisawa Mfg. Co., Ltd., thickness 94 μm) was impregnated with the varnish, and dried at 140° C. for 5 minutes in a vertical drying oven to give a prepreg. The residual solvent amount of the prepreg was 1 to 0.1 wt % of the curable resin composition without the glass cloth, and the thickness of the prepreg was 120 μm.

Preparation of Metal-Clad Laminate Precursor.

The film with a metal film and the prepreg prepared above were each cut into a size of 340 mm×500 mm by a cutting machine. Thereafter, two sheets of prepreg were disposed between two sheets of film with a metal film and, using a vacuum press machine (MNPC-V-750-750-5-200) manufactured by Meiko Co., Ltd., the temperature was raised from room temperature to 130° C. at the degree of vacuum $1 \times 10^{-3}$ MPa, pressure 10 kgf/cm² and temperature rise rate 3° C./minute, which state was maintained for 30 minutes, and the temperature was raised to 190° C. at pressure 30 kgf/cm² and temperature rise rate 3° C./minute, which state was maintained for 90 minutes, to give a metal-clad laminate precursor.

Removal of Support Layer and Release Layer.

A support layer (PET film) was peeled off, and the release layer (hydroxypropylmethylcellulose phthalate layer) was removed by dissolving in a 1 wt % aqueous sodium carbonate solution.

Removal of Metal Film Layer by Etching.

The substrate (metal-clad laminate precursor) after removal of the support layer and the release layer was dipped in an aqueous ferric chloride solution at 25° C. for 2 minutes to remove the copper layer on the insulating layer by etching. Then, the substrate was washed with water and dried. The absence of the copper layer on the insulating layer was visually confirmed.

Formation of Conductor Layer.

The insulating layer after removal of the above-mentioned copper layer by etching was subjected to electroless copper plating (by electroless copper plating process using a reagent solution manufactured by ATOTECH Japan K.K. to be described in detail below) to give a metal-clad laminate. The film thickness of electroless copper plating was 1 μm. Then, electro copper plating was performed to form a conductor layer (copper layer) having a total thickness of 30 μm to give a circuit board.

Electroless copper plating process using reagent solution manufactured by ATOTECH Japan K.K.

1. alkaline cleaning (washing of resin surface and charge-tuning)
    trade name: Cleaning cleaner Securiganth 902
    condition: 60° C. for 5 minutes
2. soft etching (washing of via bottom, conductor copper)
    aqueous sulfuric acid acidic sodium peroxodisulfate solution
    condition: 30° C. for 1 minute
3. pre-dip (charge-tuning on surface for attachment of Pd in next step)
    trade name: Pre. Dip Neoganth B
    condition: room temperature 1 minute
4. activator (attach Pd to resin surface)
    trade name: Activator Neoganth 834
    condition: 35° C. for 5 minutes
5. reduction (Pd attached to resin is reduced)
    mixture of
    trade name: Reducer Neoganth WA
    : Reducer Acceralator 810 mod.
    condition: 30° C. for 5 minutes
6. electroless copper plating (precipitate Cu on resin surface (Pd surface))
    mixture of
    trade name: Basic Solution Printganth MSK-DK
    : Copper solution Printganth MSK
    : Stabilizer Printganth MSK-DK
    : Reducer Cu
    condition: 35° C. for 20 minutes Example 2

In the same manner as in Example 1 except that a prepreg with a metal film was used instead of the film with a metal film, a circuit board was prepared. The method for producing a prepreg with a metal film and a method for producing a circuit board are shown in the following.

Preparation of Prepreg.

A varnish of a curable resin composition similar to that in Example 1 was prepared. A 2116 glass cloth (manufactured by Arisawa Mfg. Co., Ltd., thickness 94 μm) was impregnated with the varnish, and dried at 140° C. for 5 minutes in a vertical drying oven. Successively, one surface of the prepreg was laminated on a polypropylene film (thickness 15 μm), and the other surface was laminated on a polyethylene film (thickness 12 μm), and the laminate was wound in a roll. The residual amount of the solvent in the prepreg layer was 1 to 0.1 wt % of the curable resin composition without the glass cloth, and the thickness of the prepreg layer was 120 μm.

Preparation of Prepreg with Metal Film.

Using a roll type laminating machine and while peeling off the polyethylene film of the above-mentioned roll-like prepreg, the prepreg was adhered to the same film with a metal film as that used in Example 1 at roll temperature 100° C., linear pressure 5 kg/cm and laminate speed 6 m/minute, such that the surface of the metal film layer contacted the prepreg, and the resulting laminate was wound in a roll to give a prepreg with a metal film.

Preparation of Metal-Clad Laminate and Circuit Board.

The roll-like prepreg with a metal film was cut into a size of 340 mm×500 mm by a cutting machine. Wrinkles or warpage were not observed in the prepreg with a metal film. The polypropylene film of two sheets of the prepreg cut as mentioned above was peeled off, and the prepreg layers were laid on top of each other with the prepreg layers being opposed. The resulting product was placed in a vacuum press machine (MNPC-V-750-750-5-200) manufactured by Meiko Co., Ltd., and the temperature was raised from room temperature to 130° C. at the degree of vacuum $1 \times 10^{-3}$ MPa, pressure 10 kgf/cm$^2$ and temperature rise rate 3° C./minute, which state was maintained for 30 minutes, and the temperature was raised to 190° C. at pressure 30 kgf/cm$^2$ and temperature rise rate 3° C./minute, which state was maintained for 90 minutes, to give a metal-clad laminate precursor. Thereafter, a metal-clad laminate and a circuit board were produced in the same manner as in Example 1.

Example 3

Preparation of Varnish for Adhesive Layer

Liquid bisphenol A type epoxy resin (epoxy equivalent 180, "Epikote 828EL" manufactured by Japan Epoxy Resins Co., Ltd., 28 parts), naphthalene type tetrafunctional epoxy resin (epoxy equivalent 163, "HP4700" manufactured by DIC Corporation, 28 parts), and phenoxy resin ("YX6954BH30" manufactured by Japan Epoxy Resins Co., Ltd., 20 parts) were dissolved in a mixed solvent of MEK (25 parts) and cyclohexanone (25 parts) while stirring with heating. Thereto was added triazine-containing phenol novolac resin (hydroxyl equivalent 125, "LA7054" manufactured by DIC Corporation, 27 parts), MEK solution (27 parts) with a 50% solid content of naphthol type curing agent (hydroxyl equivalent 215, "SN-485" manufactured by Tohto Kasei Co., Ltd.), curing catalyst ("2E4MZ" manufactured by SHIKOKU CHEMICALS CORPORATION, 0.1 part), spherical silica (average particle size 0.5 μm, "SOC2" manufactured by Admatechs Company Limited, 70 parts), ethanol and toluene (1:1) solution (30 parts) with a 15% solid content of polyvinyl butyral resin ("KS-1" manufactured by SEKISUI CHEMICAL CO., LTD.), and the mixture was uniformly dispersed in a high-speed rotary mixer to give a varnish of a curable resin composition.

Formation of Adhesive Layer on Film with Metal Film.

The above-mentioned varnish was applied with a die coater onto the metal film layer of a film with a metal film produced in the same manner as in Example 1, and the solvent was removed in a hot air drying oven to form an adhesive layer with a 10 μm-thick curable resin composition layer.

Preparation of Prepreg.

MEK solution (30 parts) with a 75% solid content of cresol novolac type epoxy resin (epoxy equivalent 215, "N-680" manufactured by DIC Corporation), 60% MEK solution (16.5 parts) of cresol novolac resin (hydroxyl equivalent 119, "KA-1165" manufactured by DIC Corporation), curing catalyst ("2E4MZ" manufactured by SHIKOKU CHEMICALS CORPORATION, 0.05 part), aluminum hydroxide (average particle size 3.0 μm, "UFE-20" manufactured by TOMOE ENGINEERING CO., LTD., 30 parts), and MEK (40 parts) were mixed, and the mixture was uniformly dispersed in a high-speed rotary mixer to give a varnish of a curable resin composition. A 2116 glass cloth (manufactured by Arisawa Mfg. Co., Ltd., thickness 94 μm) was impregnated with the varnish, and dried at 140° C. for 5 minutes in a vertical drying oven to give a prepreg. The residual solvent amount of the prepreg was 1 to 0.1 wt % of the curable resin composition without the glass cloth, and the thickness of the prepreg was about 120 μm.

Preparation of Metal-Clad Laminate and Circuit Board.

The film with a metal film provided with the above-mentioned adhesive layer and the prepreg were each cut into a size of 340 mm×500 mm by a cutting machine. Thereafter, two sheets of prepreg were disposed between two sheets of film with a metal film and the resulting product was placed in a vacuum press machine (MNPC-V-750-750-5-200) manufactured by Meiko Co., Ltd., the temperature was raised from room temperature to 130° C. at the degree of vacuum $1 \times 10^{-3}$ MPa, pressure 10 kgf/cm$^2$ and temperature rise rate 3° C./minute, which state was maintained for 30 minutes, and the temperature was raised to 190° C. at pressure 30 kgf/cm$^2$ and temperature rise rate 3° C./minute, which state was maintained for 90 minutes, to give a metal-clad laminate precursor. Thereafter, a metal-clad laminate and a circuit board were produced in the same manner as in Example 1.

Example 4

In the same manner as in Example 1 except that the following varnish was used for the preparation of a prepreg, a metal-clad laminate and a circuit board were prepared.

Preparation of Varnish for Prepreg.

Liquid bisphenol A type epoxy resin (epoxy equivalent 180, "jER828EL" manufactured by Japan Epoxy Resins Co., Ltd., 30 parts) and biphenyl type epoxy resin (epoxy equivalent 291, "NC3000H" manufactured by Nippon Kayaku Co., Ltd., 30 parts) were dissolved in a mixed solvent of MEK (15 parts) and cyclohexanone (15 parts) while stirring with heating. Thereto were added active ester compound ("EXB9460-65T" manufactured by DIC Corporation, active ester equivalent 223, toluene solution with a 65% solid content, 80 parts), accelerator ("4-dimethylaminopyridine" manufactured by KOEI CHEMICAL CO., LTD., 0.5 part), spherical silica (average particle size 0.5 μm, "SOC2" with aminosilane treatment, manufactured by Admatechs Company Limited, 120 parts) and phenoxy resin ("YL7213BH30" manufactured by Japan Epoxy Resins Co., Ltd., 40 parts), and the mixture was uniformly dispersed in a high-speed rotary mixer to give a resin varnish.

Example 5

Using the film with the metal film and provided with the adhesive layer and the prepreg prepared in Example 3, a metal-clad laminate and a circuit board were prepared as follows.

Two sheets of the prepreg prepared in Example 3 were provided with two sheets of electrolytic copper foil ("JTC foil" manufactured by Nikko Materials Co., Ltd., 18 μm), and they were placed in a vacuum press machine (MNPC-V-750-750-5-200) manufactured by Meiko Co., Ltd., the temperature was raised from room temperature to 130° C. at the degree of vacuum $1\times10^{-3}$ MPa, pressure 10 kgf/cm$^2$ and temperature rise rate 3° C./minute, which state was maintained for 30 minutes, and the temperature was raised to 190° C. at pressure 30 kgf/cm$^2$ and temperature rise rate 3° C./minute, which state was maintained for 90 minutes. Thereafter, the laminates were dipped in an aqueous ferric chloride solution at 25° C. for 35 minutes to remove the metal film layer (copper layer), washed with water, and dried at 130° C. for 30 minutes to leave only the prepreg layer.

Thereafter, the film with a metal film and provided with the adhesive layer as prepared in Example 3 was laminated on both surfaces of the laminate board using a batch system vacuum-pressurization laminating machine MVLP-500 (manufactured by Meiko Co., Ltd., trade name). The lamination involved depressurizing for 30 seconds to set the pressure to not more than 13 hPa, and then pressing at 100° C. and pressure 0.74 MPa for 30 seconds. After the lamination, the laminate was cured at 180° C. for 30 minutes in an oven to give a metal-clad laminate precursor. Thereafter, a metal-clad laminate and a circuit board were produced in the same manner as in Example 1.

Example 6

A metal-clad laminate precursor was prepared in the same manner as in Example 1, and a support layer was removed.

The substrate (metal-clad laminate precursor) after removal of the above-mentioned support layer was drilled to form a through hole with a hole diameter of 0.105 μm. The drill processing was performed using "ND-1V212" manufactured by Hitachi Via Mechanics, Ltd. Thereafter, the release layer was removed in the same manner as in Example 1, and the following desmear treatment was performed. In the same manner as in Example 1, the metal film layer was removed, and electroless copper plating and electro copper plating were performed to give a circuit board. Fine copper plating was also formed on the wall surface of the through hole.

Desmear Treatment.

The circuit board was dipped in a swelling solution (Swelling Dip Securiganth P manufactured by ATOTECH Japan K.K.) at 80° C. for 5 minutes, dipped in a roughening solution (Concentrate Compact P manufactured by ATOTECH Japan K.K. (aqueous solution of KMnO$_4$: 60 g/L and NaOH: 40 g/L)) at 80° C. for 10 minutes, and lastly in a neutralizing solution (Reduction Solution Securiganth P manufactured by ATOTECH Japan K.K.) at 40° C. for 5 minutes. Thereafter, the circuit board was washed with water and dried.

Example 7

In the same manner as in Example 1 and except that the glass cloth of the metal-clad laminate precursor was a 1037 glass cloth manufactured by Arisawa Mfg. Co., Ltd. (thickness 28 μm), a metal-clad laminate precursor was produced, and the support layer was removed.

In the same manner as in Example 6, a through hole was formed in the above-mentioned substrate (metal-clad laminate precursor) after removal of the support layer, and a desmear treatment was performed. Thereafter, the metal film layer was removed, and electroless copper plating and electro copper plating were performed in the same manner as in Example 1 to give a circuit board. The SEM photograph of the sectional view of the circuit board observed by S-4800 manufactured by Hitachi High-Technologies Corporation at magnification of 350-fold is shown in FIG. 1. Therefrom it is clear that the through hole filling plating was applied to the inside of the through hole when the electro copper plating was performed.

Example 8

The same prepreg as that in Example 1 was prepared, vacuum press and removal of a metal film layer were performed, and then electroless copper plating was performed. Thereafter, the surface was treated with a 5% aqueous sulfuric acid solution for 30 seconds, and a dry film ("ALPHO 20A263" manufactured by Nichigo-Morton Co., Ltd., thickness 20 μm) was laminated on the electroless copper plating layer by a vacuum laminating machine. The lamination involved depressurizing for 30 seconds at 70° C. and pressure 0.1 MPa to set the pressure to not more than 13 hPa, and then pressing for 20 seconds using a batch system vacuum-pressurization laminating machine MVLP-500 (manufactured by Meiko Co., Ltd., trade name). Thereafter, a glass mask having a pattern of L (line)/S (space)=8/8 to 20/20 was placed on a PET film (protection layer of dry film), and the laminate was exposed to UV-Lump at 150 mJ/cm$^2$. 1% Aqueous sodium carbonate solution at 30° C. was applied by a 0.15 MPa spray for 30 seconds. Thereafter, the laminate was washed with water and developed. The developed substrate was subjected to electro copper plating to form a conductor layer, and 3% NaOH solution at 50° C. was applied by a 0.2 MPa spray to detach the dry film. Thereafter, a redundant metal film layer was removed by the SAC process manufactured by EBARA DENSAN LTD. to form wiring, whereby a circuit board was obtained.

Comparative Example 1

A circuit board was produced in the same manner as in Example 1 except that an electrolytic copper foil ("JTC foil" manufactured by Nikko Materials Co., Ltd., 18 μm) was used instead of the film with the metal film.

Comparative Example 2

On the metal film layer of the cured prepreg before removal of the metal film layer as produced in Example 1 was further laminated an electroless copper plating (0.7 μm). Thereafter, wiring was formed in the same manner as in Example 8 to give a circuit board.

The circuit boards produced in Examples 1-8 and Comparative Examples 1-2 were subjected to measurement and evaluation as follows. The results are shown in Table 1 and Table 2.

Measurement of Peel Strength of Conductor Layer.

The peel strength of the conductor layer was measured according to JIS C6481. The circuit boards obtained in the above-mentioned Examples and Comparative Examples were cut into 150×30 mm small pieces. A slit of width 10 mm and length 100 mm was made in a small piece of copper foil with a cutter, one end of the copper foil was detached, held between clamping jaws, and the load at the time the piece was peeled off by 35 mm in the perpendicular direction at room temperature at 50 mm/minute was measured by Instron universal testing machine and the value was taken as the peel strength. The thickness of the conductor layer was about 30 μm.

Measurement of Arithmetic Mean Roughness (Ra Value) of Surface of Insulating Layer.

The copper plating layer and the metal film layer (copper layer) on the circuit substrate prepared were removed with a copper etchant and, using a non-contact type surface roughness meter (WYKO NT3300 manufactured by Veeco Instruments Inc.), Ra value (arithmetic mean roughness) of the surface of the insulating layer was determined at VSI contact mode with the range of measurement with 50× lens of 121 μm×92 μm. The Ra value was measured at 5 randomly set measurement ranges and an average of the five measured values was taken.

Evaluation of Fine Wiring Formation.

Using glass masks with L (line)/S (space) patterns of 8 μm/8 μm, 10 μm/10 μm, 12 μm/12 μm, 15 μm/15 μm and 20 μm/20 μm, wiring was formed, and the undercut of the wiring was observed with S-4800 manufactured by Hitachi High-Technologies Corporation at magnification ×10000.

In Tables, "○" means less undercut and fine wiring formation and "x" means development of detached wiring.

TABLE 1

| | Ex. 1 | Ex. 2 | Ex. 3 | Ex. 4 | Ex. 5 | Ex. 6 | Ex. 7 | Ex. 8 | Comp Ex. 1 | Comp Ex. 2 |
|---|---|---|---|---|---|---|---|---|---|---|
| Ra (nm) | 60 | 60 | 60 | 130 | 60 | 60 | 50 | 60 | >1000 | 50 |
| peel strength (kgf) | 0.70 | 0.70 | 0.65 | 0.89 | 1.00 | 0.70 | 0.79 | 0.70 | 1.20 | 0.80 |

TABLE 2

| L (μm)/S (μm) | 8/8 | 10/10 | 12/12 | 15/15 | 20/20 |
|---|---|---|---|---|---|
| Example 8 | ○ | ○ | ○ | ○ | ○ |
| Comparative Example 2 | x | x | x | ○ | ○ |

From Table 1, it is clear that the production method of a circuit board of the present invention can produce a circuit board having a conductor layer with high peel strength on the surface of an insulating layer with a small Ra value (arithmetic mean roughness). In contrast, in Comparative Example 1 where a circuit board was prepared from a metal-clad laminate with an electrolytic copper foil, the peel strength was as high as about 1.20 kgf, but Ra value (arithmetic mean roughness) of the surface of the insulating layer was extremely high and was not less than 1000 nm.

From Table 2, it is clear that the production method of a circuit board of the present invention can form a fine wiring of L/S=8 μm/8 μm. In contrast, in Comparative Example 2 free of (C) a step of removing the metal film layer, the metal film layer on the surface of the insulating layer becomes thick, which is not suitable for fine wiring, since removal of a metal film layer in unnecessary parts is influenced by the dissolution of the wiring pattern.

The method of the present invention can afford a copper-clad laminate having a conductor layer with superior peel strength formed on the smooth surface of an insulating layer. In such a copper-clad laminate, a plating seed layer can be removed by etching under mild conditions, and dissolution of the wiring pattern can be suppressed. Therefore, the laminate is particularly suitable for the production of a circuit board required to have a fine wiring.

Where a numerical limit or range is stated herein, the endpoints are included. Also, all values and subranges within a numerical limit or range are specifically included as if explicitly written out.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A method of producing a metal-clad laminate comprising:
    (A) providing one or more sheets of prepreg between two sheets of film having a first metal film layer on a support layer, and heating and pressing them under reduced pressure, to form an insulating layer consisting of the prepreg to obtain a metal-clad laminate precursor;
    (B) removing said support layer;
    (C) removing said first metal film layer, after removing said support layer; and
    (D) forming a second metal film layer on a surface of said insulating layer by electroless plating,
    wherein said second metal film is formed on a surface of said insulating layer from which said first metal film has been removed.

2. The method according to claim 1, further comprising:
    (A') further curing the insulating layer in (A) after providing one or more sheets of prepreg between two sheets of film having a first metal film layer on a support layer, and heating and pressing them under reduced pressure.

3. The method according to claim 1, wherein said first metal film layer of said film is formed by one or more kinds of methods selected from the group consisting of vapor deposition, sputtering, and ion plating.

4. The method according to claim 1, wherein said first metal film layer of said film is formed with copper.

5. The method according to claim 1, wherein said first metal film layer is removed by etching in (C) removing said first metal film layer.

6. The method according to claim 1, wherein said second metal film layer is formed with copper in (D) forming a second metal film layer on a surface of said insulating layer by electroless plating.

7. The method according to claim 1, further comprising:
    (E) forming a through hole after (A) providing one or more sheets of prepreg between two sheets of film having a first metal film layer on a support layer, and heating and pressing them under reduced pressure, to obtain a metal-clad laminate precursor, (B) removing said support layer, or (D) forming a second metal film layer on a surface of said insulating layer by electroless plating.

8. The method according to claim 7, further comprising (F) performing desmearing after (E) forming a through hole.

9. The method according to claim 1, wherein said surface of said insulating layer after (C) removing said first metal film layer has an arithmetic mean roughness (Ra value) of not more than 200 nm.

10. The method according to claim 1, wherein said film comprises a first metal film layer formed on a release layer formed on said support layer.

11. The method according to claim 10, wherein said release layer is formed with one or more kinds of water-soluble polymers selected from the group consisting of a water-soluble cellulose resin, a water-soluble polyester resin, and a water-soluble acrylic resin.

12. The method according to claim 10, further comprising (H) removing said release layer after (B) removing said support layer.

13. The method according to claim 10, wherein said release layer has a layer thickness of 0.01 μm to 20 μm.

14. The method according to claim 1, wherein an adhesive layer is present between said first metal film layer and said prepreg in (A) providing one or more sheets of prepreg between two sheets of film having a first metal film layer on a support layer, and heating and pressing them under reduced pressure, to form an insulating layer comprising the prepreg and the adhesive layer to obtain a metal-clad laminate precursor.

15. The method according to claim 14, wherein said prepreg and said adhesive layer comprise an epoxy resin and a curing agent.

16. The method according to claim 1, wherein said first metal film layer of said film has a layer thickness of 25 nm to 5000 nm.

17. The method according to claim 1, wherein said support layer has a layer thickness of 10 μm to 70 μm.

18. The method according to claim 1, wherein said support layer is a plastic film.

19. A method of producing a circuit board using a metal-clad laminate, comprising (G) forming a conductor layer by electroplating after the method according to claim 1.

20. The method according to claim 19, further comprising:
 (A') further curing the insulating layer in (A) after providing one or more sheets of prepreg between two sheets of film having a first metal film layer on a support layer, and heating and pressing them under reduced pressure.

21. The method according to claim 19, further comprising (E) forming a through hole after (A) providing one or more sheets of prepreg between two sheets of film having a first metal film layer on a support layer, and heating and pressing them under reduced pressure, to obtain a metal-clad laminate precursor, or (B) removing said support layer, or (D) forming a second metal film layer on said surface of said insulating layer by electroless plating.

22. The method according to claim 21, further comprising (F) performing desmearing after (E) forming a through hole.

23. The method according to claim 19, wherein said surface of said insulating layer after (C) removing said first metal film layer has an arithmetic mean roughness (Ra value) of not more than 200 nm.

24. The method according to claim 19, wherein said film comprises a first metal film layer formed on a release layer formed on said support layer.

25. The method according to claim 24, wherein said release layer is formed from one or more kinds of water-soluble polymers selected from the group consisting of a water-soluble cellulose resin, a water-soluble polyester resin, and a water-soluble acrylic resin.

26. The method according to claim 24, further comprising (H) removing said release layer after (B) removing said support layer.

27. The method according to claim 24, wherein said release layer has a layer thickness of 0.01 μm to 20 μm.

28. The method according to claim 19, wherein an adhesive layer is present between said first metal film layer and said prepreg in (A) providing one or more sheets of prepreg between two sheets of film having a first metal film layer on a support layer, and heating and pressing them under reduced pressure, to form an insulating layer comprising the prepreg and the adhesive layer to obtain a metal-clad laminate precursor.

29. The method according to claim 28, wherein said prepreg and said adhesive layer comprise an epoxy resin and a curing agent.

30. The method according to claim 19, wherein said first metal film layer of said film has a layer thickness of 25 nm to 5000 nm.

31. The method according to claim 19, wherein said support layer has a layer thickness of 10 μm to 70 μm.

32. The method according to claim 19, wherein said support layer is a plastic film.

\* \* \* \* \*